(12) United States Patent
Utagawa et al.

(10) Patent No.: US 8,705,652 B2
(45) Date of Patent: *Apr. 22, 2014

(54) PULSE WIRELESS COMMUNICATION DEVICE

(75) Inventors: Hitoshi Utagawa, Koganei (JP); Toshiaki Matsui, Koganei (JP)

(73) Assignees: National Institute of Information and Communications Technology, Koganei-shi (JP); Communications Research Laboratory, Inc., Koganei-shi (JP)

( * ) Notice: Subject to any disclaimer, the term of this patent is extended or adjusted under 35 U.S.C. 154(b) by 281 days.

This patent is subject to a terminal disclaimer.

(21) Appl. No.: 13/123,338

(22) PCT Filed: Oct. 6, 2009

(86) PCT No.: PCT/JP2009/067683
§ 371 (c)(1),
(2), (4) Date: Jul. 5, 2011

(87) PCT Pub. No.: WO2010/041753
PCT Pub. Date: Apr. 15, 2010

(65) Prior Publication Data
US 2011/0255634 A1 Oct. 20, 2011

(30) Foreign Application Priority Data
Oct. 8, 2008 (JP) .................... 2008-261670

(51) Int. Cl.
*H04L 27/00* (2006.01)
(52) U.S. Cl.
USPC ........................................... 375/295
(58) Field of Classification Search
USPC ........................................... 375/295
See application file for complete search history.

(56) References Cited

U.S. PATENT DOCUMENTS 3,702,977 A * 11/1972 Olsson .................... 331/107 DP
6,246,295 B1 * 6/2001 Matsui et al. ................... 331/99

(Continued)

FOREIGN PATENT DOCUMENTS

JP 2000 261234 9/2000
JP 2004 186726 7/2004

(Continued)

OTHER PUBLICATIONS

Gresham, I., et al., "Ultra-Wideband Radar Sensors for Short-Range Vehicular Applications," IEEE Transactions on Microwave Theory and Techniques, vol. 52, No. 9, pp. 2105-2122, (Sep. 2004).

(Continued)

*Primary Examiner* — Jaison Joseph
(74) *Attorney, Agent, or Firm* — Oblon, Spivak, McClelland, Maier & Neustadt, L.L.P.

(57) ABSTRACT

To provide a microwave/milliwave UWB pulse wireless communication device that enables realization of structural simplification, high performance, compact integration, easy design, low power consumption, and low cost. A radiation type oscillator is configured by a radiation type oscillator substrate S1 equipped with a microwave transistor 1 for generating negative resistance by short-duration operation and a resonant cavity structure, a high-frequency pulse signal of an oscillation frequency/frequency bandwidth determined based on negative resistance produced by the short-duration operation of the microwave transistor 1 and the resonant cavity structure is generated as a transmitted RF signal and simultaneously radiated into space, and the radiation type oscillator is caused to perform oscillating operation when a received RF signal arriving from an external wireless communication device enters the radiation type oscillator, whereby a received data signal is established based on acquisition of an IF signal owing to mixing by the radiation type oscillator itself.

9 Claims, 21 Drawing Sheets

(56) References Cited

U.S. PATENT DOCUMENTS

| | | | |
|---|---|---|---|
| 2003/0224743 A1* | 12/2003 | Okada et al. | 455/127.2 |
| 2005/0156780 A1* | 7/2005 | Bonthron et al. | 342/107 |
| 2005/0277443 A1* | 12/2005 | Ozluturk | 455/562.1 |
| 2006/0017606 A1* | 1/2006 | Hayata et al. | 342/41 |
| 2010/0117891 A1 | 5/2010 | Utagawa et al. | |
| 2010/0315990 A1 | 12/2010 | Utagawa et al. | |

FOREIGN PATENT DOCUMENTS

| | | |
|---|---|---|
| JP | 2007 124628 | 5/2007 |
| WO | 2007 114522 | 10/2007 |

OTHER PUBLICATIONS

Kawano, Y., et al., "An RF Chipset for Impulse Radio UWB Using 0.13 μm InP-HEMT Technology," IEEE, pp. 316-319, (2006).

International Search Report issued Dec. 28, 2009 in PCT/JP09/067683 filed Oct. 6, 2009.

U.S. Appl. No. 13/121,063, filed Jun. 13, 2011.

U.S. Appl. No. 13/123,115, filed Jul. 12, 2011.

U.S. Appl. No. 13/123,135, filed Apr. 7, 2011.

* cited by examiner

PULSE WIRELESS COMMUNICATION DEVICE

TECHNICAL FIELD

This invention relates to an ultra-wideband (UWB) impulse-type wireless data transmitter-receiver, particularly to a technology for realizing structure simplification, low cost, and high performance in a microwave/milliwave band device incompatible with a complicated circuit configuration.

BACKGROUND ART

UWB technologies have attracted attention as communication technologies in recent years. Although these technologies use extremely broad frequency bands, they are extremely low in power spectral density and therefore have the advantage of being able to share frequencies already in use. Moreover, they have advantages such as that by using short pulses of several hundred picoseconds or shorter, they make it possible to perform high-speed data transmission.

In conventional microwave/milliwave band UWB technology, a pulse wireless communication device is configured with a pulse signal generator, wideband filter and wideband antenna each connected using a transmission line (see, for example, Non-patent Document 1 and Non-patent Document 2).

[Non-patent Document 1] Ian Gresham, "Ultra-Wideband Radar Sensors for Short-Range Vehicular Applications", MTT VOL. 52, No. 9, pp. 2111-2113, September 2004

[Non-patent Document 2] Yoichi Kawano, Yasuhiko Nakasha, Kaoru Yokoo, Satoshi Masuda, Tsuyoshi Takahashi, Tatsuya Hirose, Yasuyuki Oishi, and Kiyoshi Hamaguchi, "An RF Chipset for Impulse Radio UWB Using 0.13 µm InP-HEMT Technology", MTT-S Int. Microwave Symp. 2006 Digest pp. 316-319

The antenna of the pulse wireless communication device in the prior art UWB technologies set forth in these Non-patent Document 1 and Non-patent Document 2 is either provided as a separate transmitting antenna and receiving antenna or as a shared receiving and transmitting antenna that is switched between transmit and receive by a switch. Moreover, as regards generation of the high-frequency pulse signals of the pulse wireless communication radar device in these prior art UWB technologies, the configuration is either by the method using an ultra-wideband filter circuit to pass only a certain part of the frequency components of a base band signal (monopulse signal or step signal generated in accordance with the base band signal) or by the method of modulating the output of a CW signal oscillator such as by passing/blocking it in a high-speed RF switch.

On the other hand, there has also been proposed a high-frequency pulse signal generating device in which the transmission line or resonant circuit is replaced by an antenna. (see, for example, Patent Document 1 and Patent Document 2).

[Patent Document 1] Unexamined Japanese Patent Publication 2004-186726

[Patent Document 2] Unexamined Japanese Patent Publication 2007-124628

The high-frequency pulse signal generating devices described in Patent Document 1 and Patent Document 2 are of the type that load a charge in an antenna that is the transmission line or resonant circuit and rapidly discharge the charge using a high-speed switch or the like. Among the frequency components generated by the high-speed discharge, the frequency components of the resonant frequency band of the antenna constituting the resonant circuit are radiated.

DISCLOSURE OF THE INVENTION

However, the inventions described in the aforesaid Non-patent Document 1 and Non-patent Document 2 are configured with the pulse signal generator, wideband filter, and wideband antenna each connected using a transmission line, so that in addition to the problem of transmission line transmission loss, the configuration is undesirable for a microwave/milliwave band device incompatible with a complicated circuit configuration.

Further, in the device configurations of the inventions described in the aforesaid Non-patent Document 1 and Non-patent Document 2, each of the various circuits in the devices, including the filters, amplifiers and RF switches, are required to exhibit ultra-wideband characteristics. For example, in the case where the pulse generation circuit and filter circuit are connected by transmission lines, multiple reflection occurs between the individual circuits unless the input/output refection coefficients of the individual circuits and the reflection coefficients of the connections are adequately small across the wideband. In addition, if the group delay characteristics of the individual circuits are not flat across the wideband, distortion will arise in the pulse waveform. Such ultra-wideband circuits are therefore more difficult to design than narrow band circuits, so that a device that requires all of the individual circuits to exhibit ultra-wideband characteristics becomes high in cost.

Moreover, the inventions described in the aforesaid Non-patent Document 1 or Non-patent Document 2 are configured to connect the high-frequency pulse signal generators and the ultra-wideband antennas using transmission lines, so that impedance is converted from the impedance of the transmission lines (usually 50Ω) to space impedance, making an ultra-wideband antenna necessary, and multiple reflection will occur at the transmission line connectors if the reflection coefficient of the antenna is not adequately small across the ultra-wideband. While a taper-structure non-resonant type antenna or a multiple-resonant type antenna is used as the antenna with such ultra-wideband characteristics, the tapered portion of the taper-structure non-resonant type antenna is unavoidably large because it must be longer than the wavelength, which is disadvantageous for overall device integration, and use of a multiple-resonant type antenna is undesirable from the viewpoint of group delay characteristics and tends to make the structure complicated.

In addition, the method of modulating the output of a CW signal oscillator by passing/blocking it in a high-speed RF switch as in the invention described in the aforesaid Non-patent Document 1 is disadvantageous for application to UWB communication due to the intrinsic presence of undesirable CW signal leakage. It is also disadvantageous from the aspect of power consumption because a CW signal oscillator circuit is in operation.

Further, the method of using a resonator or filter circuit to select and pass only a certain part of the frequency components of a base band signal (monopulse signal or step signal generated in accordance with the base band signal) as in the invention described in the aforesaid Non-patent Document 2 is susceptible to wasteful loss of the energy of the unpassed frequency components and tends to be high in cost because the pulse signal generator requires ultrahigh speed.

Further, in order to generate a high-frequency signal component to be radiated, the inventions described in Patent Document 1 and Patent Document 2 require a switch or the like that operates at very high speed, which tends to make the structure complicated because the switch driver also requires high rapidity. And owing to the lack of receiving capability, it is necessary in the case of conducting communication to separately incorporate a receiving antenna, transmit-receive switch, receiver circuit and the like.

The object of the present invention is therefore to provide a microwave/milliwave band UWB pulse wireless communication device enabling realization of structural simplification, high performance, compact integration, easy design, low power consumption, and low cost.

In order to achieve this object, the pulse wireless communication device according to claim 1 is characterized in that a radiation type oscillator is formed by integrating a three-electrode high-frequency amplifying device to generate negative resistance in a resonant cavity and share an antenna function for radiating an electromagnetic wave into space; the three-electrode high-frequency amplifying device is momentarily operated based on a transmit data signal to establish a short-duration negative resistance and a high-frequency pulse signal of an oscillating frequency/frequency band width determined based on the negative resistance and the structure of the resonant cavity is generated and simultaneously radiated into space; the high-frequency pulse signal radiated into space constitutes a transmitted RF signal; and the radiation type oscillator is caused to perform oscillating operation when a received RF signal arriving from an external wireless communication device enters the radiation type oscillator, whereby a received data signal is established based on acquisition of an IF signal owing to mixing by the radiation type oscillator itself.

Further, the invention according to claim 2 is characterized in being configured so that in the pulse wireless communication device set out in claim 1, the three electrodes of the three-electrode high-frequency amplifying device of the radiation type oscillator are a controlled current inflow electrode, a controlled current outflow electrode and a control electrode; a monopulse signal is supplied to the controlled current inflow electrode or the controlled current outflow electrode and the power of the monopulse signal itself is used as source power to establish short-duration negative resistance; and an IF band load means is interposed between the controlled current inflow electrode and the monopulse signal feed line and either the IF signal is extracted from between the IF band load means and the controlled current inflow electrode or an IF band load means is interposed between the controlled current outflow electrode and the monopulse signal feed line and the IF signal is extracted from between the IF band load means and the controlled current outflow electrode.

Further, the invention according to claim 3 is characterized in being configured so that in the pulse wireless communication device set out in claim 1, the three electrodes of the three-electrode high-frequency amplifying device of the radiation type oscillator are a controlled current inflow electrode, a controlled current outflow electrode and a control electrode; a monopulse signal is supplied to the control electrode to cause short-duration controlled current to flow and establish short-duration negative resistance; and an IF band load means is interposed between the controlled current inflow electrode and a direct current source feed line and either the IF signal is extracted from between the IF band load means and the controlled current inflow electrode or an IF band load means is interposed between the controlled current outflow electrode and the direct current source feed line and the IF signal is extracted from between this IF band load means and the controlled current outflow electrode.

Further, the invention according to claim 4 is characterized in that in the pulse wireless communication device set out in claim 2 or 3, a monopulse signal generation circuit is integrated into the radiation type oscillator.

Further, the invention according to claim 5 is characterized in that in the pulse wireless communication device set out in any of claims 1 to 4, amplification gain in the IF band is used to amplify an IF signal from direct current possessed by the three-electrode high-frequency amplifying device of the radiation type oscillator during oscillating operation and during mixing operation.

Further, the invention according to claim 6 is characterized in that in the pulse wireless communication device set out in any of claims 1 to 5, a pulse train pattern is defined in the high-frequency pulse signal of the transmitted RF signal and the radiation type oscillator itself is used as a correlator.

Further, the invention according to claim 7 is characterized in that in the pulse wireless communication device set out in any of claims 1 to 6, when the received RF signal enters the radiation type oscillator, the radiation type oscillator is caused to perform oscillating operation at an arbitrary frequency different from the frequency of the high-frequency pulse signal of the received RF signal.

Further, the invention according to claim 8 is characterized in that in the pulse wireless communication device set out in any of claims 1 to 7, a band-pass filter means for selectively filtering waves of required frequency is provided to be disposed an appropriate distance apart from the radiation surface of the radiation type oscillator.

Further, the invention according to claim 9 is characterized in that in the pulse wireless communication device set out in any of claims 1 to 8, a grounding conductor structure is provided on the radiation direction side of the radiation type oscillator for preventing leakage of unnecessary signal components of a frequency lower than the frequency of the radiated high-frequency pulse signal.

In accordance with the invention of claim 1, a radiation type oscillator is formed by integrating a three-electrode high-frequency amplifying device to generate negative resistance in a resonant cavity and share an antenna function for radiating an electromagnetic wave into space; the three-electrode high-frequency amplifying device is momentarily operated based on a transmit data signal to establish a short-duration negative resistance and a high-frequency pulse signal of an oscillating frequency/frequency band width determined based on the negative resistance and the structure of the resonant cavity is generated and simultaneously radiated into space; the high-frequency pulse signal radiated into space constitutes a transmitted RF signal; and the radiation type oscillator is caused to perform oscillating operation when a received RF signal arriving from an external wireless communication device enters the radiation type oscillator, whereby a received data signal is established based on acquisition of an IF signal owing to mixing by the radiation type oscillator itself, and, as a result, the structure is simple, design is uncomplicated, and compact integration and cost reduction are easy.

This simple structure is a feature that suppresses variation in characteristics, is beneficial from the aspect of achieving high yield in production, and also advantageous for ensuring high reliability. Particularly in the production of a milliwave device requiring precise and fine film processing technology, structural simplicity of the device is extremely advantageous from the aspect of quality control.

Further, since in the pulse wireless communication device according to claim 1 the oscillator, transmitting antenna, receiving antenna and mixer forms a harmonious whole, it operates at very high speed and has high performance as a UWB device. Moreover, since no transmission line for supplying power to the antenna is present, no transmission loss arises, so that the DC/RF conversion efficiency is high and power consumption low. In addition, the oscillation is of very short duration, with a transistor being intermittently operated to pass current for short periods, and power consumption is therefore low.

In addition, since by operating principle no CW signal leakage (single spectrum) appears at the center of the radiated UWB spectrum in the pulse wireless communication device according to claim 1, there is the advantage of being able to efficiently utilize the band within the legally defined UWB communication spectral mask.

Further, while the method of using a resonator or filter circuit to select and pass only a certain part of the frequency components of a base band signal (monopulse signal or step signal generated in accordance with the base band signal) is susceptible to wasteful loss of the energy of the unpassed frequency components and tends to be high in cost because the pulse signal generator requires ultrahigh speed, the pulse signal generator according to the present invention does not require a base band signal that contains the radiated high-frequency signal component in advance and is therefore good in designability and advantageous for achieving low cost.

Thanks to the foregoing advantages, the pulse wireless communication device according to claim 1 can be effectively realized with simpler structure, higher performance, more compact integration, lower power consumption and lower cost than in the case of configuring a device with the same performance using conventional technology.

Further, in accordance with the invention of claim 2, a configuration is adopted wherein the three electrodes of the three-electrode high-frequency amplifying device of the radiation type oscillator are a controlled current inflow electrode, a controlled current outflow electrode and a control electrode; a monopulse signal is supplied to the controlled current inflow electrode or the controlled current outflow electrode and the power of the monopulse signal itself is used as source power to establish short-duration negative resistance; and an IF band load means is interposed between the controlled current inflow electrode and the monopulse signal feed line and either the IF signal is extracted from between the IF band load means and the controlled current inflow electrode or an IF band load means is interposed between the controlled current outflow electrode and the monopulse signal feed line and the IF signal is extracted from between the IF band load means and the controlled current outflow electrode, whereby no direct current source is required for establishing negative resistance, thus enabling the pulse wireless communication device to be realized with a simple structure at relatively low cost.

Further, in accordance with the invention of claim 3, a configuration is adopted wherein the three electrodes of the three-electrode high-frequency amplifying device of the radiation type oscillator are a controlled current inflow electrode, a controlled current outflow electrode and a control electrode; a monopulse signal is supplied to the control electrode to cause short-duration controlled current to flow and establish short-duration negative resistance; and an IF band load means is interposed between the controlled current inflow electrode and a direct current source feed line and either the IF signal is extracted from between this IF band load means and the controlled current inflow electrode or an IF band load means is interposed between the controlled current outflow electrode and the direct current source feed line and the IF signal is extracted from between the IF band load means and the controlled current outflow electrode, whereby even a circuit of small load driving capability can be used as the monopulse signal generation circuit, thus enabling the pulse wireless communication device to be realized with a simple structure at relatively low cost.

Further, in accordance with the invention of claim 4, the monopulse signal generation circuit is integrated into the radiation type oscillator, whereby the issue of multiple reflection between the radiation type oscillator and the monopulse signal generation circuit can be easily avoided, thus enabling the pulse wireless communication device to be realized with a simple structure at relatively low cost.

Further, in accordance with the invention of claim 5, amplification gain in the IF band is used to amplify an IF signal from direct current possessed by the three-electrode high-frequency amplifying device of the radiation oscillator during oscillating operation and during mixing operation, whereby an IF signal of large signal-to-noise ratio can be established, thus enabling a high-sensitivity pulse wireless communication device to be realized.

Further, in accordance with the invention of claim 6, a pulse train pattern is defined in the high-frequency pulse signal of the transmitted RF signal and the radiation oscillator itself is used as a correlator, whereby an IF signal of large signal-to-noise ratio can be established, thus enabling a high-sensitivity pulse wireless communication device to be realized.

Further, in accordance with the invention of claim 7, when the received RF signal enters the radiation type oscillator, the radiation type oscillator is caused to perform oscillating operation at an arbitrary frequency different from the frequency of the high-frequency pulse signal of the received RF signal, whereby an IF signal of a desired frequency band can be acquired, thus improving designability.

Further, in accordance with the invention of claim 8, a band-pass filter means for selectively filtering waves of required frequency is provided to be disposed an appropriate distance apart from the radiation surface of the radiation type oscillator, whereby radiation of unnecessary signals can be prevented and a desired harmonic frequency component can be selected and radiated, thus making it possible to acquire a higher-quality radiation signal.

Further, in accordance with the invention of claim 9, a grounding conductor structure is provided on the radiation direction side of the radiation type oscillator for preventing leakage of unnecessary signal components of a frequency lower than the frequency of the radiated high-frequency pulse signal, whereby leakage of the base band signal and base band pulse signal components and radiation of unnecessary signals can be prevented, thus making it possible to acquire a higher quality radiation signal.

BEST MODES FOR CARRYING OUT THE INVENTION

Next, embodiments of the pulse wireless communication device according to the present invention will be explained based on the attached drawings.

Figure 1:
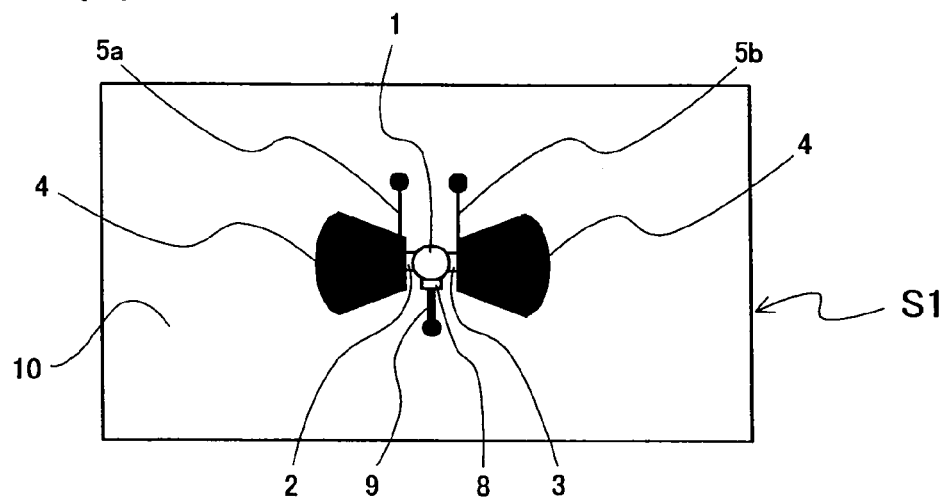
FIG. 1 is a set of schematic diagrams of a radiation type oscillator substrate in a pulse wireless communication device according to a first embodiment of the present invention.
Figure 1:
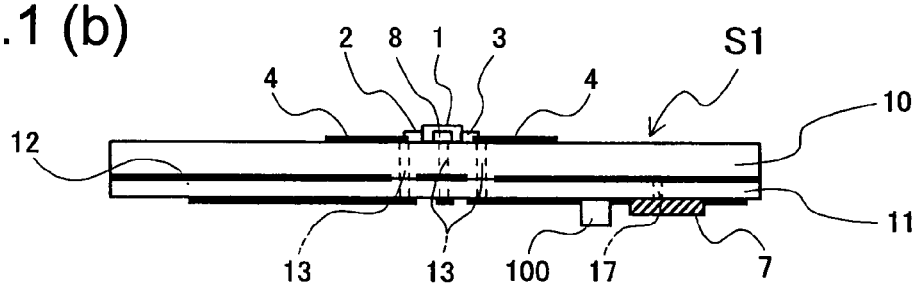

FIG. 1 shows the basic configuration of a pulse wireless communication device according to a first embodiment. This pulse wireless communication device comprises a radiation type oscillator substrate S1, a signal source that supplies a base band signal thereto (not shown), a power supply that performs DC bias feed (not shown), and a processor that performs analysis and processing of an acquired IF signal (not shown).

The radiation type oscillator substrate S1 here functions as a "radiation type oscillator that integrates a three-electrode high-frequency amplifying device to generate negative resistance in a resonant cavity and shares an antenna function for radiating an electromagnetic wave into space." And the high-frequency pulse signal radiated into space by this radiation type oscillator becomes a transmitted RF signal at time intervals and timing based on the transmit data signal. On the other hand, when a received RF signal arriving from an external wireless communication device enters this radiation type oscillator, a received data signal can be established based on acquisition of an IF signal owing to mixing by the radiation type oscillator itself. Note that it suffices to suitably utilize a known, existing method for the analysis and processing performed by the IF signal processor.

Further, the three-electrode high-frequency amplifying device is an element that can realize amplification capability by controlling a large current with a small voltage or current, inclusive of an element configured using a discrete transistor or multiple discrete transistors, but is not limited to parts that can be handled individually and can include one built into a semiconductor wafer by a semiconductor process. The control electrode in this three-electrode high-frequency amplifying device is an electrode, corresponding to a gate or base, that is applied with a control voltage or made to accept inflow (or outflow) of a control current. Further, the controlled current inflow electrode is an electrode into which the controlled current flows, and the controlled current outflow electrode is an electrode from which the controlled current flows out, one corresponding to a drain or collector and the other to a source or emitter, depending on whether the element structure is N type or P type, or is NPN type or PNP type.

Figure 1C:
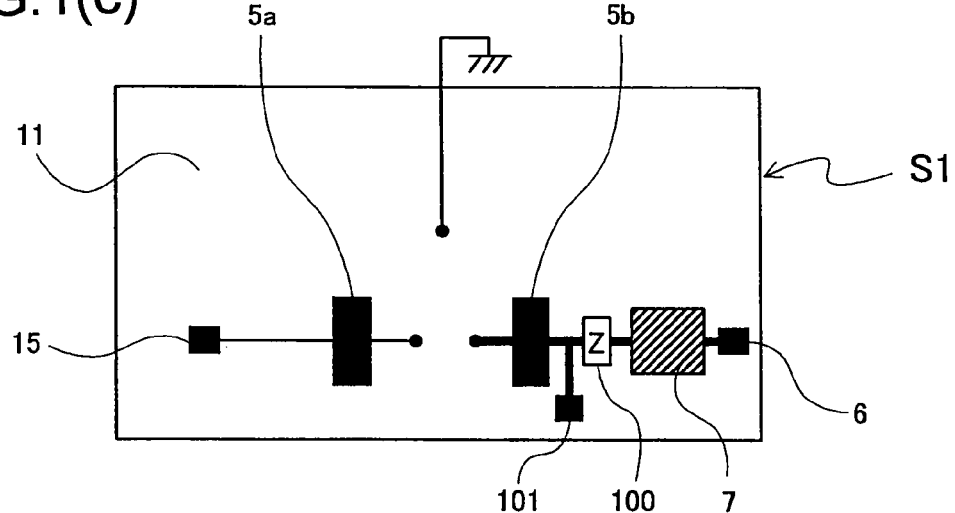

The radiation type oscillator substrate S1 configures the required circuits using a three-layer substrate with an inner-layer GND 12 constituting a grounding conductor layer sandwiched between a front-side dielectric substrate 10 and a rear-side dielectric substrate 11. Specifically, an RF circuit section of the radiation type oscillator is constituted by the front surface and the inner-layer GND 12, and an RF choke circuit and a base band circuit are constituted by the inner-layer GND 12 and the rear surface. Further, a monopulse generation circuit 7 is integrated on the side of the rear-side dielectric substrate 11. Note that FIG. 1(a) shows the plane of the radiation type oscillator substrate S1 (front of the front-side dielectric substrate 10), FIG. 1(b) schematically shows the vertical cross-sectional structure of the radiation type oscillator substrate S1, and FIG. 1(c) shows the bottom surface of the radiation type oscillator substrate S1 (rear surface of the rear-side dielectric substrate 11).

A pair of conductor patches 4, 4 are provided axial-symmetrically on the front side of the front-side dielectric substrate 10 to form a radiation type surface, a gate electrode 2 constituting the control electrode and a drain electrode 3 constituting the controlled current inflow electrode of a high-frequency transistor 1 constituting the three-electrode high-frequency amplifying device and disposed between the pair of conductor patches 4, 4 are respectively connected to the conductor patches 4, 4, and an RF choke circuit 5a for supplying gate DC bias voltage is connected to the gate electrode 2. Voltage is fed from an unshown DC power supply to this RF choke circuit 5a through a DC gate voltage feed terminal 15. Further, a conductor patch 4 and an RF choke circuit 5b are connected to the drain electrode 3. An IF band load means 100 is interposed between and series-connected with the RF choke circuit 5b and the monopulse generation circuit 7 (configured of a high-speed logic IC and a switch, for example), and a base band signal input terminal 6 is connected to the monopulse generation circuit 7. An IF signal output terminal 101 is connected between the RF choke circuit 5b and the IF band load means 100. The GND of the monopulse generation circuit 7 is connected to the inner-layer GND 12 via a through-hole 17. An impedance line 9 satisfying an oscillation condition is connected to the source electrode 8 constituting the controlled current outflow electrode of the high-frequency transistor 1 and through-hole grounded to the inner-layer GND 12. And the high-frequency transistor 1, the conductor patches 4, part of the RF choke circuits 5a, 5b, and the impedance line 9 are formed on the surface of the front-side dielectric substrate 10 (surface of the high-frequency pulse radiation side), and the remaining portions of the RF choke circuits 5a, 5b and the monopulse generation circuit 7 are formed on the rear side of the rear-side dielectric substrate 11. The RF choke circuits 5a, 5b include through-hole portions 13.

The conductor patches 4 here function as a resonator and antenna, and constitute a feedback circuit. A radiation type oscillator that generates and radiates an RF signal is realized by area/shape design and the like of the conductor patches 4 and the power fed to the high-frequency transistor.

Figure 2:
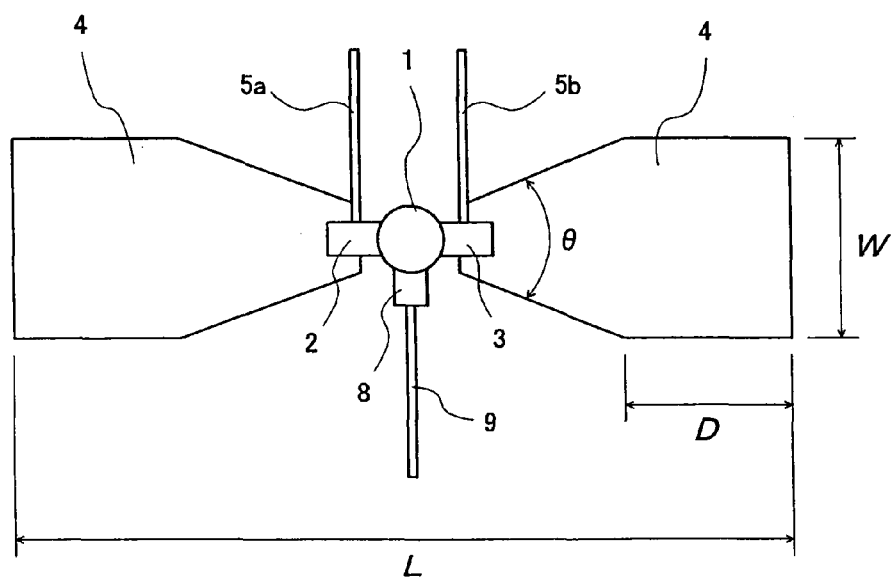
FIG. 2 is an explanatory configuration diagram of conductor patches and a microwave transistor in a radiation type oscillator.

FIG. 2 shows the pair of axial symmetrical conductor patches 4, which conductor patches 4 each has a tapered portion of equiangular inclination that is connected to the gate electrode 2 or drain electrode 3 of the high-frequency transistor 1, and the tapered portions are disposed in close proximity with the lengths D of the parallel portions of equal width W located beyond the pointed portions defined as D and the distance from one end to the other end of the pair of conductor patches 4 (total length) defined as L.

In the so-configured conductor patches 4, the coupling strength of the high-frequency transistor 1 and resonator can be regulated by regulating the divergence angle θ of the tapered portions connected to the gate electrode 2 or drain electrode 3 of the high-frequency transistor 1, and freedom in selecting the various conditions necessary for setting the oscillation condition can be established by appropriately selecting the length L, width W and parallel portion length D. Further, although not shown in the drawings, a stable oscillating condition can be ensured by setting the interval h between the conductor patches 4 and the inner-layer GND 12 (substantially the thickness of the front-side dielectric substrate 10) at between 1/15 and 1/5 the oscillating wavelength λ. Note that the configuration of the conductor patches 4 is not particularly limited and any structure is acceptable insofar a resonant cavity suitable for the generated RF signal can be configured by the front-side dielectric substrate 10 and inner-layer GND 12. Modifications of the resonant cavity will be explained later.

In order to operate the radiation type oscillator substrate S1 of the foregoing configuration, a suitable DC bias voltage is applied to the DC gate voltage feed terminal 15, and a base band signal for operating the monopulse generation circuit 7 is input to the base band signal input terminal 6. The monopulse output signal from the monopulse generation circuit 7 is input to the drain electrode 3 of the high-frequency transistor 1 through the IF band load means 100 and RF choke circuit 5b, the monopulse output signal itself becomes the source power, and negative resistance is produced by the high-frequency transistor 1 for a short-duration. Short-duration RF band generation and radiation, namely generation and radiation of a high-frequency pulse signal, occurs at the frequency and bandwidth determined by this short-duration negative resistance and the structures of the conductor patches 4 and front-side dielectric substrate 10.

This short-duration RF generation and radiation is conducted by the base band signal of a time interval and timing based on the transmit data signal, and the high-frequency pulse signal generated and radiated based thereon becomes the transmitted RF signal and is transmitted to an external wireless communication device that is the other communicating party. On the other hand, a received RF signal arriving from an external wireless communication device enters the radiation type oscillator substrate S1.

When this received RF signal enters the radiation type oscillator substrate S1, the radiation type oscillator itself produces an IF signal by mixing if a monopulse output signal is again input from the monopulse generation circuit 7 to the drain electrode 3 or if a bias voltage giving rise to an RF band generation and radiation operating state is applied to the drain electrode 3. A received data signal can be established by extracting this IF signal from the IF signal output terminal 101 and analyzing and processing it with a computer or other processor.

Note that if the oscillation condition is satisfied while the monopulse signal is being input to the drain electrode 3, the DC bias voltage applied to the DC gate voltage feed terminal 15 can be applied by self-biasing without need to supply it from an external power supply. For example, if the oscillation condition is satisfied by the gate bias voltage of 0 [V], a power supply for DC bias for feeding DC bias is unnecessary if the DC gate voltage feed terminal 15 is electrically connected to the inner-layer GND or the like to apply 0 [V] to the gate.

Figure 3:
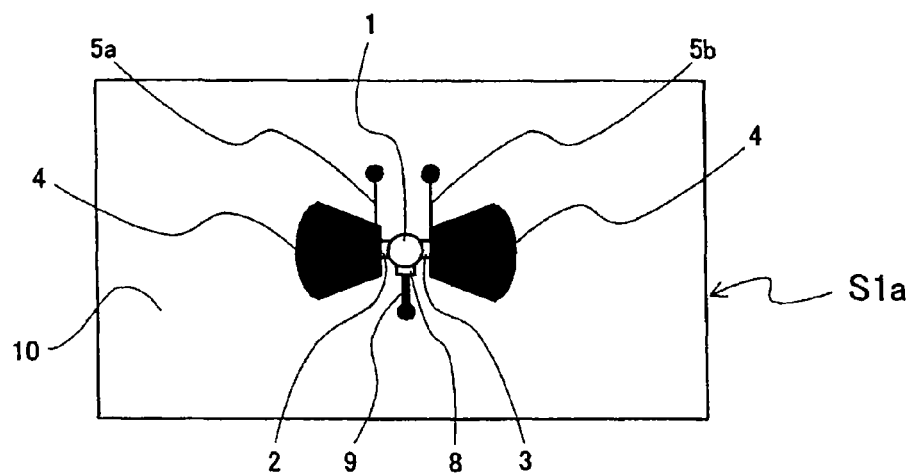
FIG. 3 is a set of schematic diagrams showing a first modification of the radiation type oscillator substrate in the pulse wireless communication device according to the first embodiment of the present invention.
Figure 3:
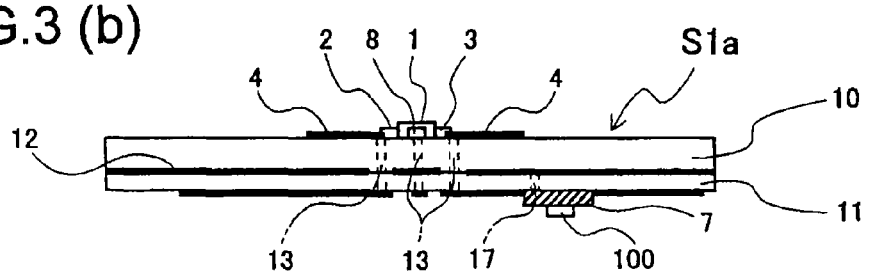
Figure 3:
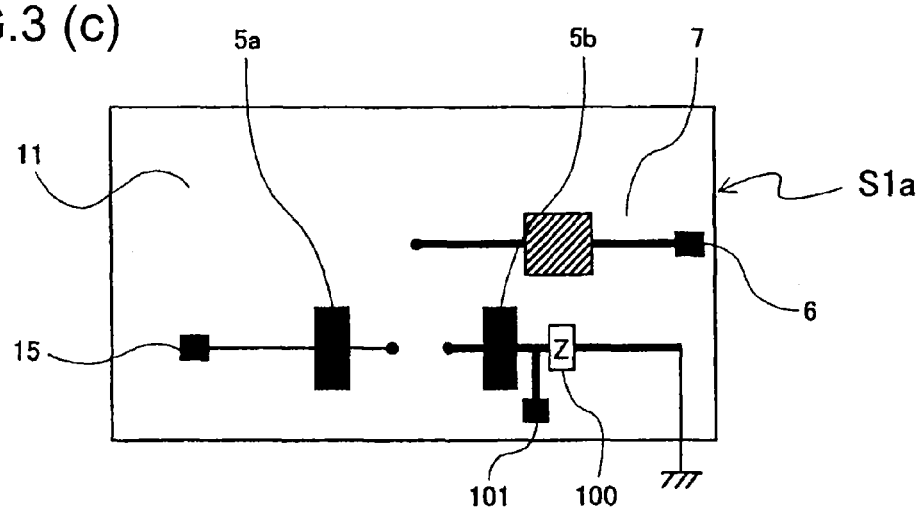

Further, it is possible, as in the first modification shown in FIG. 3 (radiation type oscillator substrate S1a), to connect the monopulse generation circuit 7 to the source electrode 8 constituting the controlled current outflow electrode, connect the IF band load means 100 to the drain electrode 3 constituting the controlled current inflow electrode, and connect the IF signal output terminal 101 between the IF band load means 100 and the drain electrode 3 to extract the IF signal. In this case, if a negative monopulse signal is output from the monopulse generation circuit 7, the ground potential merely changes from the source electrode to the drain electrode relative to in the radiation type oscillator substrate S1 shown in FIG. 1, and since there is only a change in the reference potential, operation as a pulse wireless communication device is the same. In other words, which electrode's potential is made the reference can be set as desired. Further, the electrode to which the monopulse signal is supplied can be appropriately selected depending on whether the transistor constituting the three-electrode high-frequency amplifying device is N type or P type, or is NPN type or PNP type.

Figure 4:
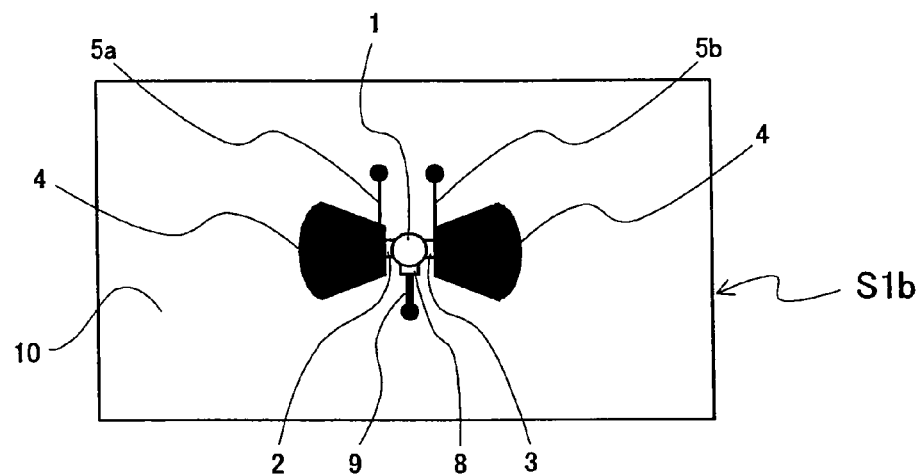
FIG. 4 is a set of schematic diagrams showing a second modification of the radiation type oscillator substrate in the pulse wireless communication device according to the first embodiment of the present invention.
Figure 4:
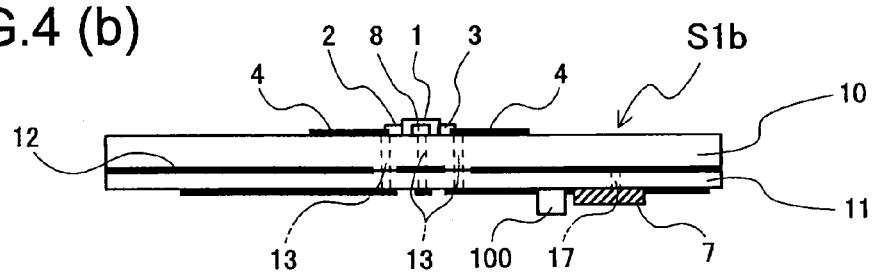
Figure 4:
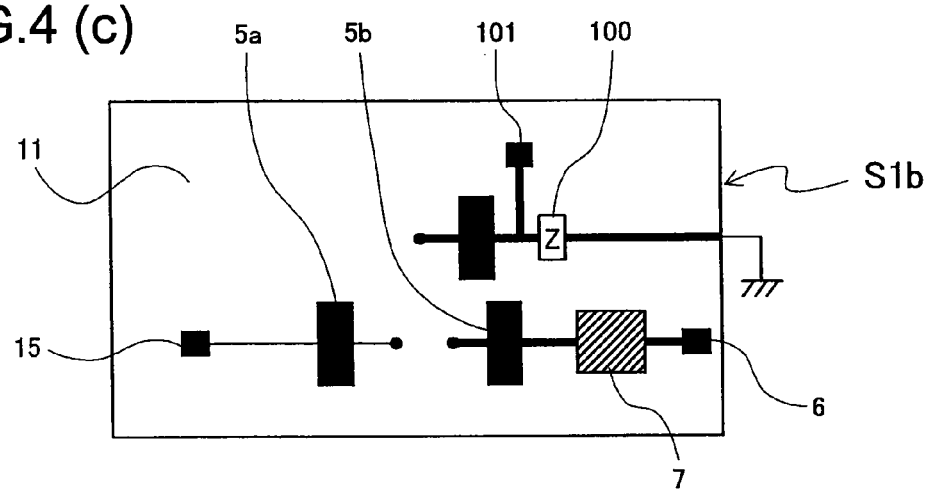

Further, it is possible, as in the second modification shown in FIG. 4 (radiation type oscillator substrate S1b), to connect the monopulse generation circuit 7 to the drain electrode 3 constituting the controlled current inflow electrode, connect the IF band load means 100 to the source electrode 8 constituting the controlled current outflow electrode, and connect the IF signal output terminal 101 between the IF band load means 100 and the source electrode 8 to extract the IF signal. In this case, the series-insertion of the IF band load means 100 in the flow path of the controlled current of the high-frequency transistor 1 is no different from in the radiation type oscillator substrate S1 shown in FIG. 1, so that an IF signal can be acquired and operation as a pulse wireless communication device is the same. Further, the electrode to which the monopulse signal is supplied can be appropriately selected depending on whether the transistor constituting the three-electrode high-frequency amplifying device is N type or P type, or is NPN type or PNP type.

Figure 5:
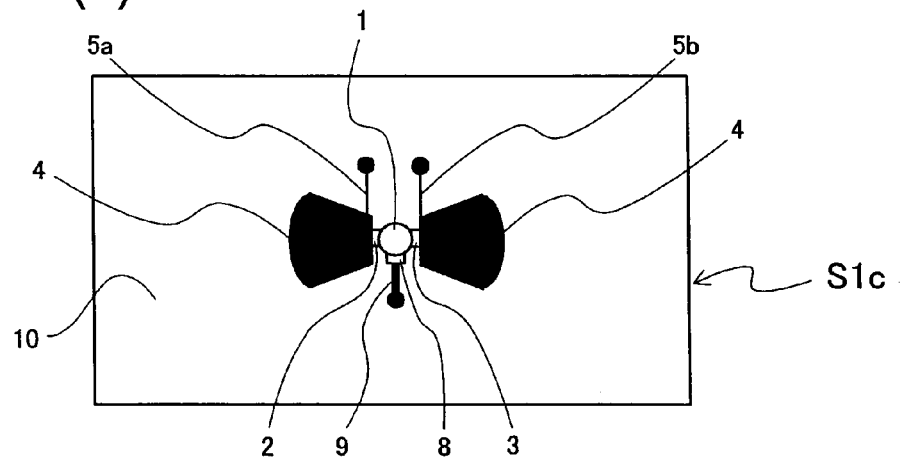
FIG. 5 is a set of schematic diagrams showing a third modification of the radiation type oscillator substrate in the pulse wireless communication device according to the first embodiment of the present invention.
Figure 5:
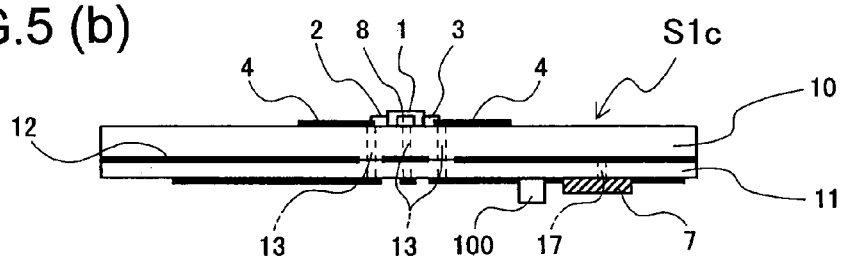
Figure 5:
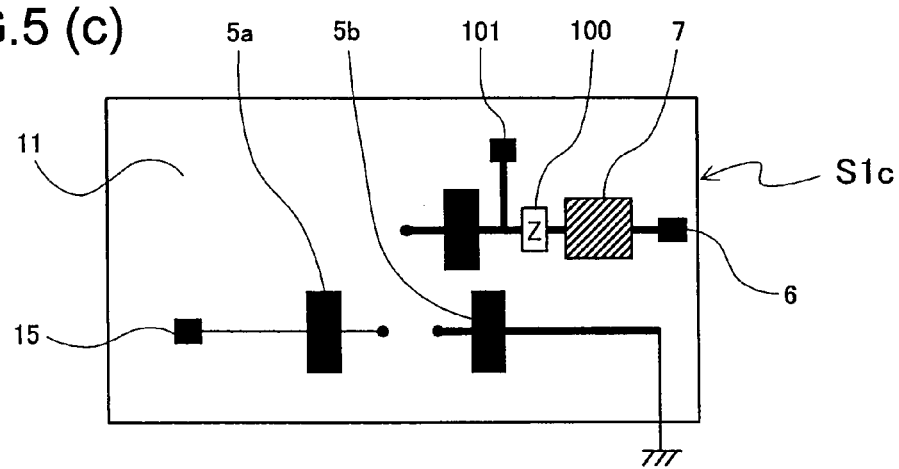

Further, it is possible, as in the third modification shown in FIG. 5 (radiation oscillator substrate S1c), to interpose and series-connect the IF band load means 100 between the source electrode 8 constituting the controlled current outflow electrode and the monopulse generation circuit 7, and connect the IF signal output terminal 101 between the source electrode 8 and the IF band load means 100 to extract the IF signal. In this case, if a negative monopulse signal is output from the monopulse generation circuit 7, the ground potential merely changes from the source electrode to the drain electrode relative to in the radiation oscillator substrate S1b of the second modification shown in FIG. 4, and since there is only a change in the reference potential, operation as a pulse wireless communication device is the same. In other words, which electrode's potential is made the reference can be set as desired. Further, the electrode to which the monopulse signal is supplied can be appropriately selected depending on whether the transistor constituting the three-electrode high-frequency amplifying device is N type or P type, or is NPN type or PNP type.

Thus, the pulse wireless communication device according to the present embodiment (pulse wireless communication device using any of the radiation oscillator substrates S1, S1a, S1b, and S1c) is simple in structure and uncomplicated in design, and compact integration and cost reduction are easy.

This simple structure is a feature that suppresses variation in characteristics, is beneficial from the aspect of achieving high yield in production, and also advantageous for ensuring high reliability. Particularly in the production of a milliwave device requiring precise and fine film processing technology, structural simplicity of the device is extremely advantageous from the aspect of quality control.

Further, since the oscillator, transmitting antenna, receiving antenna and mixer forms a harmonious whole, the operation is very high speed and performance as a UWB device is high. Moreover, since no transmission line for supplying power to the antenna is present, no transmission loss arises, so that the DC/RF conversion efficiency is high and power consumption low. In addition, the oscillation is of very short duration, with a transistor being intermittently operated to pass current for short periods, and power consumption is therefore low.

In addition, since by operating principle no CW signal leakage (single spectrum) appears at the center of the radiated UWB spectrum, there is the advantage of being able to efficiently utilize the band within the legally defined UWB communication spectral mask.

Further, while the method of using a resonator or filter circuit to select and pass only a certain part of the frequency components of a base band signal (monopulse signal or step signal generated in accordance with the base band signal) is susceptible to wasteful loss of the energy of the unpassed frequency components and tends to be high in cost because the pulse signal generator requires ultrahigh speed, the pulse wireless communication device according to the present invention does not require a base band signal that contains the radiated high-frequency signal component in advance and is therefore good in designability and advantageous for achieving low cost.

Further, the configuration uses the power of the monopulse signal itself as source power to establish short-duration negative resistance, so that no direct current source is required for establishing negative resistance, thus enabling the pulse wireless communication device to be realized with a simple structure at relatively low cost.

Thus, the pulse wireless communication device according to the present embodiment can be configured using a radiation type oscillator of simple structure to enable high performance, compact integration, easy design, low power consumption, and low cost.

A pulse wireless communication device according to a second embodiment will be explained next based on FIG. 6.

The pulse wireless communication device of the present embodiment comprises a radiation type oscillator substrate S2, a signal source that supplies a base band signal thereto (not shown), a power supply that performs DC bias feed (not shown), and a processor that performs analysis and processing of an acquired IF signal (not shown). Further, the radiation oscillator substrate S2 of the pulse wireless communication device of the present embodiment configures the required circuits using a three-layer substrate with an inner-layer GND 12 constituting a grounding conductor layer sandwiched between a front-side dielectric substrate 10 and a rear-side dielectric substrate 11; an RF circuit section of the radiation type oscillator is constituted by the front surface and the inner-layer GND 12; and an RF choke circuit and a base band circuit are constituted by the inner-layer GND 12 and the rear surface. In addition, a monopulse generation circuit 7 is integrated on the side of the rear-side dielectric substrate 11.

A conductor patch 4 and an RF choke circuit 5a for supplying a monopulse signal are connected to a gate electrode 2 of a high-frequency transistor 1. A conductor patch 4 and an RF choke circuit 5b for supplying drain voltage are connected to the drain electrode 3 of the high-frequency transistor 1. An IF band load means 100 is interposed between and series-connected with this RF choke circuit 5b and a DC drain feed terminal 18, and an IF signal output terminal 101 is connected between the RF choke circuit 5b and the IF band load means 100. Voltage is supplied to the DC drain feed terminal 18 from an unshown direct current source. The monopulse generation circuit 7 is series-connected between the RF choke circuit 5a and a base band signal input terminal 6. An impedance line 9 satisfying an oscillation condition is connected to the source electrode 8 of the high-frequency transistor 1 and grounded. The high-frequency transistor 1, the conductor patches 4, part of the RF choke circuits 5a, 5b, and the impedance line 9 are formed on the surface of the front-side dielectric substrate 10 (surface of the high-frequency pulse radiation side), and the remaining portions of the RF choke circuits 5a, 5b and the monopulse generation circuit 7 are formed on the rear side of the rear-side dielectric substrate 11. The RF choke circuits 5a, 5b include through-hole portions 13.

In order to operate the radiation oscillator substrate S2 of the foregoing configuration, a suitable DC voltage is applied to the DC drain voltage feed terminal 18, and a base band signal for operating the monopulse generation circuit 7 is input to the base band signal input terminal 6. The monopulse output signal from the monopulse generation circuit 7 is input to the gate electrode 2 of the high-frequency transistor 1 through the RF choke circuit 5a, this monopulse signal opens the gate for a short duration, short-duration drain current flows, and negative resistance is produced by the high-frequency transistor 1 for a short-duration. Short-duration RF band generation and radiation, namely generation and radiation of a high-frequency pulse signal, occurs at the frequency and bandwidth determined by this short-duration negative resistance and the structures of the conductor patches 4 and front-side dielectric substrate 10.

This short-duration RF generation and radiation is conducted by the base band signal of a time interval and timing based on the transmit data signal, and the high-frequency pulse signal generated and radiated based thereon becomes the transmitted RF signal and is transmitted to an external wireless communication device that is the other communicating party. On the other hand, a received RF signal arriving from an external wireless communication device enters the radiation oscillator substrate S1

When this received RF signal enters the radiation oscillator substrate S2, the radiation type oscillator itself produces an IF signal by mixing if a monopulse output signal is again input from the monopulse generation circuit 7 to the gate electrode 2 or if a bias voltage giving rise to an RF band generation and radiation operating state is applied to the gate electrode 2. A received data signal can be established by extracting this IF signal from the IF signal output terminal 101, imputing it to a processor, and analyzing and processing it.

Note that in the present embodiment, the gate of the high-frequency transistor 1 is opened by the monopulse signal voltage, making it necessary to set a suitable bias voltage so that the gate assumes a closed state (pinch off) at the time of no signal (during the period between a given monopulse and the next monopulse). Setting such a bias voltage makes it possible to quench the RF band generation and radiation by the short-duration negative resistance.

Figure 6:
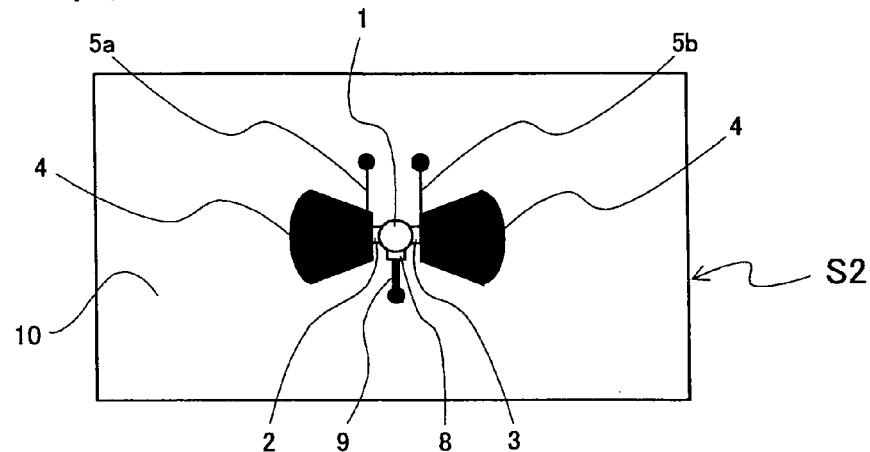
FIG. 6 is a set of schematic diagrams of a radiation type oscillator substrate in a pulse wireless communication device according to a second embodiment of the present invention.
Figure 6:
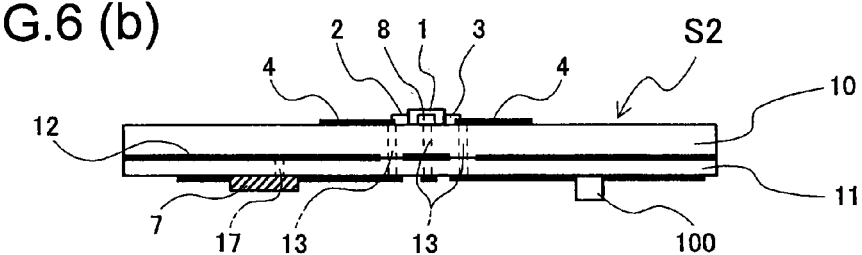
Figure 6:
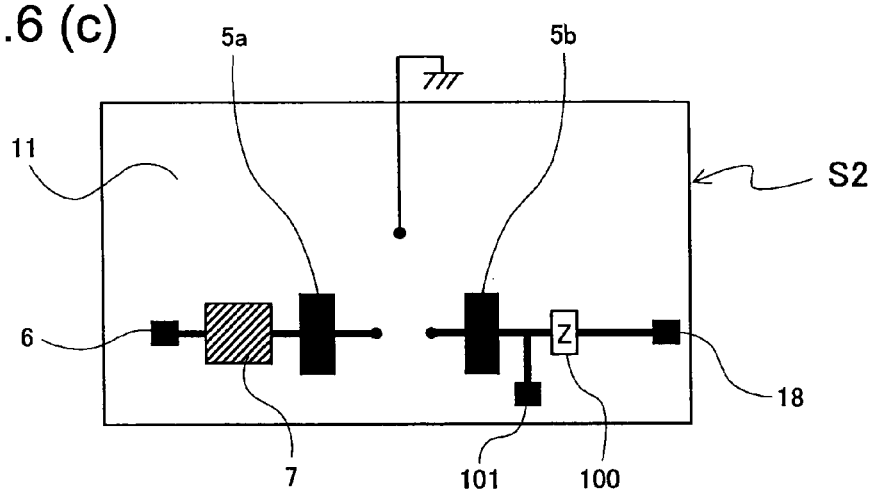
Figure 7:
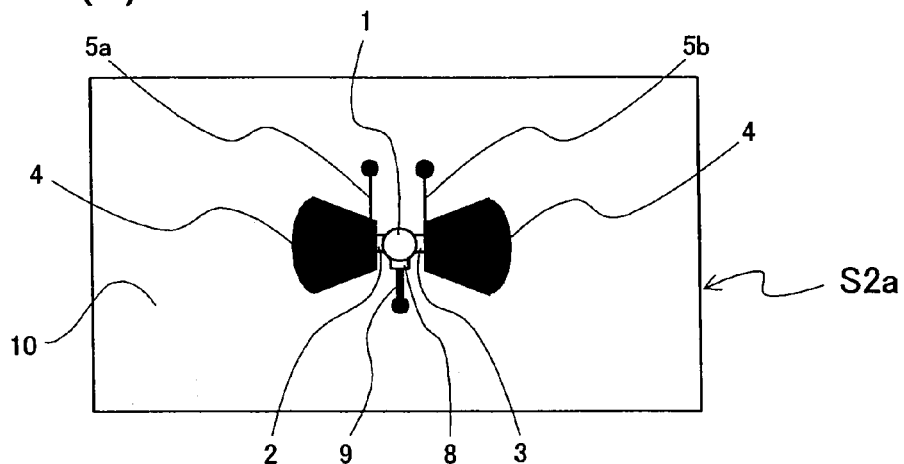
FIG. 7 is a set of schematic diagrams showing a first modification of the radiation type oscillator substrate in the pulse wireless communication device according to the second embodiment of the present invention.
Figure 7:
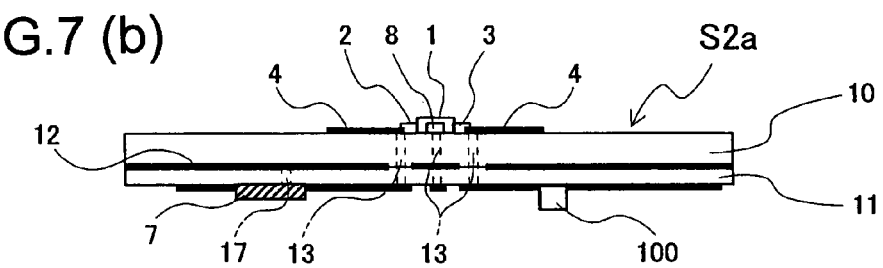
Figure 7:
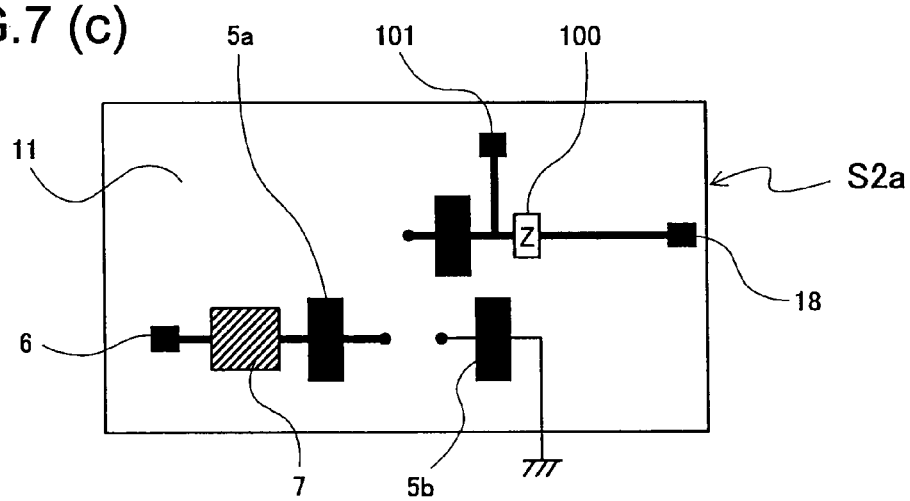

Further, it is possible, as in the modification shown in FIG. 7 (radiation oscillator substrate S2a), to connect the IF band load means 100 to the source electrode 8 constituting the controlled current outflow electrode, and connect the IF signal output terminal 101 between this IF band load means 100 and the source electrode 8 to extract the IF signal. In this case, the series-insertion of the IF band load means in the flow path of the controlled current of the high-frequency transistor 1 is no different from in the radiation oscillator substrate S2 shown in FIG. 6, so that an IF signal can be acquired and operation as a pulse wireless communication device is the same. Further, the electrode to which the monopulse signal is supplied can be appropriately selected depending on whether the transistor constituting the three-electrode high-frequency amplifying device is N type or P type, or is NPN type or PNP type.

Further, while the potential of the source electrode 8 is the ground potential in a pulse wireless communication device using the radiation oscillator substrate S2 shown in FIG. 6, and the potential of the drain electrode 3 is the ground potential in the pulse wireless communication device using the radiation oscillator substrate S2a shown in FIG. 7, which electrode's potential is made the reference can be set as desired.

Thus, the wireless communication device of the present embodiment requires only that the gate can be ON/OFF controlled with respect to the high-frequency transistor 1, which makes it possible to use a monopulse generation circuit of lower output power and lower drive capacity than in the aforesaid first embodiment and thus to realize a pulse wireless communication device that is simple in structure and relatively low in cost.

Note that the waveform of the aforesaid monopulse signal in the pulse wireless communication device according to the embodiments set out in the foregoing is not particularly limited and can be rectangular, Gaussian or triangular. Moreover, the rise time of the waveform does not need rapidity. For example, considering a triangular waveform, it is not necessary for the radiated high-frequency signal component to be contained in the triangular waveform signal. Considering the rise from the trough to the peak of the crest of the triangular waveform, insofar as the oscillation condition is satisfied a little before the crest thereof and the oscillation condition is departed from a little after the crest thereof, it is acceptable even if the rise time should be long. This is because the radiated high-frequency signal component depends on the negative resistance and the structure of the resonant cavity.

Further, the high-frequency transistor 1 used as the three-electrode high-frequency amplifying device for configuring the radiation type oscillator in the pulse wireless communication device according to the aforesaid embodiments is, for example, a field effect transistor (FET) such as an IG-FET (Insulated Gate FET), HEMT (High Electron Mobility Transistor), MESFET (Metal-Semiconductor FET), inclusive of a MOS-FET, or a bipolar transistor (BJT: Bipolar Junction Transistor) such as an HBT (Hetero-junction Bipolar Transistor), and the type is not particularly limited insofar as it has amplification capability that controls a large current with a small voltage or current.

In addition, the internal structure of the three-electrode high-frequency amplifying device is not particularly limited either, and an element of a structure combining multiple discrete transistors, such as Darlington connected transistors or cascade connected transistors, is acceptable. For example, in the case of using Darlington connected transistors, there is the advantage of being able to establish a high current amplification factor unattainable with discrete transistors.

Further, the pulse wireless communication device according to the embodiments set out in the foregoing can be implemented with an HMIC (hybrid microwave integrated circuit) or can be implemented with an MMIC (Monolithic Microwave integrated circuit). Moreover, it can be implemented with a three-dimensional integrated circuit using a LTCC (Low Temperature Co-fired Ceramics) or the like. In other words, as seen in the radiation oscillator substrates S1~S2 shown in the first and second embodiments, a high-frequency transistor 1 that is a discrete part need not be mounted on the substrate, and the three-electrode high-frequency amplifying device can be monolithically built into a semiconductor wafer together with the resonant cavity (conductor patches or the like) by the same semiconductor process. Of particular note is that since the size of the resonant cavity is small owing to the short wavelength of the milliwave band radio wave, building in the three-electrode high-frequency amplifying device monolithically (MMIC) enables further miniaturization and weight reduction and has the advantage of enabling high product quality and high productivity by high-precision semiconductor processing technology.

Further, although the function of the RF choke circuits in the pulse wireless communication device according to the embodiments set out in the foregoing is to prevent the RF signal from leaking to the DC power supply side or the monopulse generation circuit 7 side, even if the RF signal should leak, operation of the radiation type oscillator will nevertheless be possible so long as the high-frequency transistor 1 can produce negative resistance exceeding the loss by the leakage. Therefore, even if the present invention is configured using a radiation type oscillator not equipped with RF choke circuits, a pulse wireless communication device can still be realized. Moreover, if the monopulse generation circuit 7 itself is a high impedance circuit in the RF band, the monopulse generation circuit 7 and the radiation type oscillator can be directly integrated to make the RF choke circuits unnecessary. In addition, the radiation oscillator substrate of three-layer substrate structure is not required for forming the RF choke circuits.

Further, the monopulse generation circuit 7 in the pulse wireless communication device according to the embodiments set out in the foregoing can be configured as a high-speed logic IC or switch, or otherwise as a circuit or the like using a Step Recovery Diode (SRD) or Nonlinear Transmission Line (NLTL). A monopulse generation circuit configured using an SRD or NLTL can make a DC power source unnecessary, so that if supply of gate bias voltage is also omitted by, for example, self-biasing the high-frequency transistor 1, a pulse wireless communication device that operates with no DC power source present can be realized. The pulse wireless communication device in this case operates like a frequency-up converter that signal-converts an RF band high-frequency pulse signal from the base band signal notwithstanding that no DC power source or local oscillator is present, thus offering a simple and easy-to-use configuration.

Further, in the wireless communication device according to the embodiments set out in the foregoing, it is possible to use the amplification gain in the IF band to amplify the IF signal from the direct current possessed by the high-frequency transistor 1 during oscillating operation and during mixing operation. Where the transconductance of the high-frequency transistor 1 during oscillating operation and during mixing operation is defined as gm [S] and the impedance of the IF band load means 100 is defined as Z [Ω], amplitude gain can be established by making gm×Z 1 or greater, thereby making it possible to establish an IF signal of large signal-to-noise ratio and thus realize a high-sensitivity pulse wireless communication device.

Further, in the pulse wireless communication device according to the embodiments set out in the foregoing, it is possible to define a pulse train pattern (template pulse) in the high-frequency pulse signal of the transmitted RF signal and use the radiation type oscillator itself as a correlator. In this case, mixing is performed only when the time at which the high-frequency pulse signal of the received RF signal enters the radiation type oscillator and the time at which the high-frequency pulse signal that becomes the transmitted RF signal of the radiation type oscillator is produced coincide, so that an IF signal of large signal-to-noise ratio can be established by correlation detection to enable realization of a high-sensitivity pulse wireless communication device.

Further, in the pulse wireless communication device according to the embodiments set out in the foregoing, it is possible, when the received RF signal enters the radiation type oscillator, to operate the radiation type oscillator to perform oscillating operation at an arbitrary frequency different from the frequency of the high-frequency pulse signal of the received RF signal. In this case, an IF signal of a desired frequency band can be acquired and designability improved. Note that in order to change the oscillation frequency of the radiation type oscillator, it suffices to load a variable capacitance element or the like in the resonant cavity and vary the capacitance at desired timing, vary the bias voltage of the high-frequency transistor at desired timing, or vary the capacitance possessed by the high-frequency transistor itself.

Further, although the pulse wireless communication device according to the embodiments set out in the foregoing is provided on the radiation oscillator substrate S with the pair of approximately fan-shaped conductor patches 4, the shape of the conductor patches constituting the resonant cavity is not particularly limited and a pair of axially symmetrical patches is not essential. Modifications of conductor patches applicable in the present invention are explained below.

Figure 8:
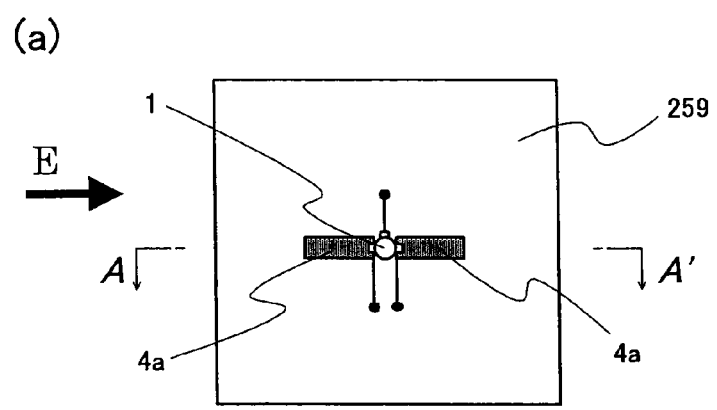
FIG. 8 is a set of schematic diagrams of a first configuration example of a resonant cavity applicable in the present invention.
Figure 8:
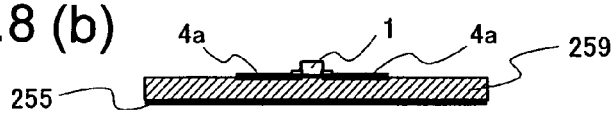
Figure 9:
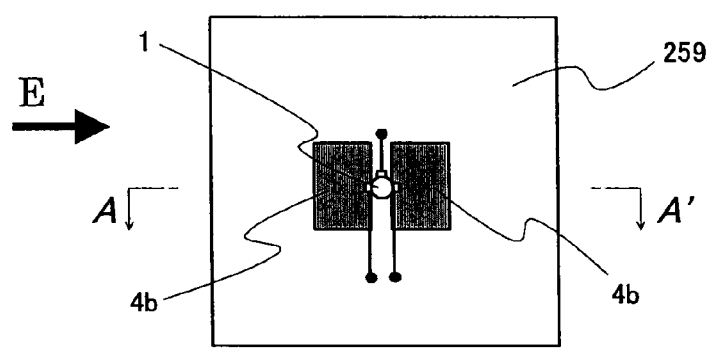
FIG. 9 is a set of schematic diagrams of a second configuration example of a resonant cavity applicable in the present invention.
Figure 9:
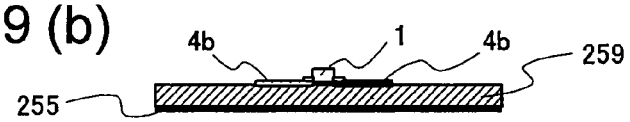
Figure 10:
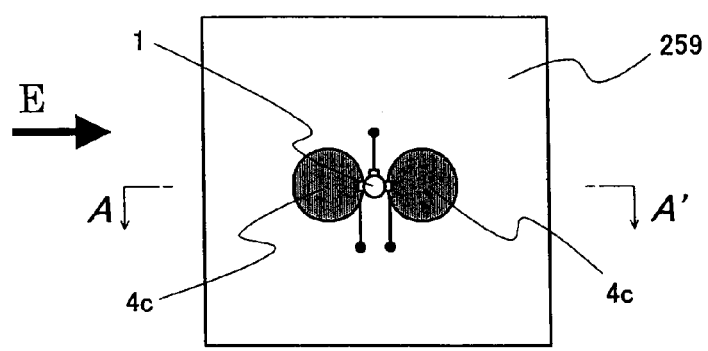
FIG. 10 is a set of schematic diagrams of a third configuration example of a resonant cavity applicable in the present invention.
Figure 10:
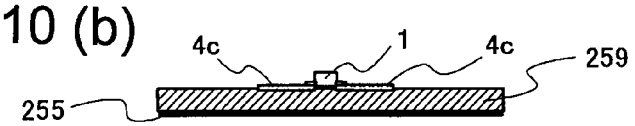
Figure 11:
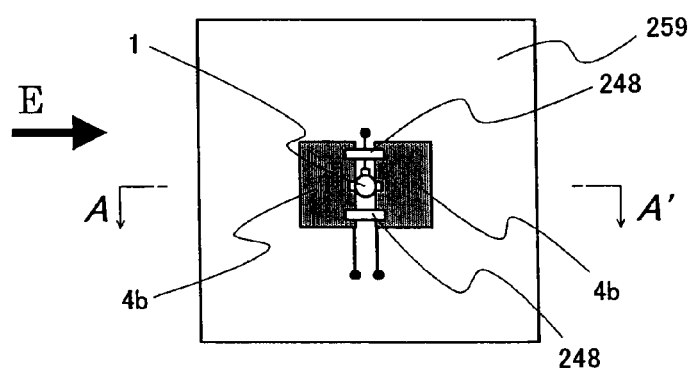
FIG. 11 is a set of schematic diagrams of a fourth configuration example of a resonant cavity applicable in the present invention.
Figure 11:
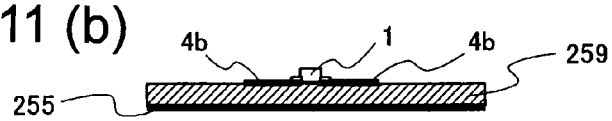

FIG. 8 is a first modification provided axial-symmetrically with a pair of rectangular conductor patches 4a, FIG. 9 is a second modification provided axial-symmetrically with a pair of rectangular conductor patches 4b, and FIG. 10 is a third modification provided axial-symmetrically with a pair of circular conductor patches 4c. In addition, the conductor patches can, for example, be polygonal, e.g. triangular, or elliptical or fan-shaped. In FIGS. 8~10, the direction of the electric field is shown by an arrow E in order to indicate the main plane of polarization. For the conductor patches 4a~4c, the GND conductor surface 255 corresponds to the inner-layer GND 12. For the conductor patches 4a~4c, the dielectric substrate 259 corresponds to the front-side dielectric substrate 10. The conductor patches 4a~4c, GND conductor surface 255 and dielectric substrate 259 form a resonant cavity and form part of a feedback circuit for oscillating operation, but if the feedback can be appropriately established, provision of the dielectric substrate 259 and GND conductor surface 255 is not absolutely necessary. For example, if the conductor patches are fabricated by sheet-metal working and a mechanism for retaining the conductor patches is available, the dielectric substrate 259 portion can be hollow. Further, as seen in the fourth modification shown in FIG. 11, feedback parts 248, such as a chip capacitor for promoting the feedback, can be mounted on the conductor patches 4b. Note that the radiation when the GND conductor surface 255 is not present is in the direction of both surfaces of the conductor patch substrates.

Figure 12:
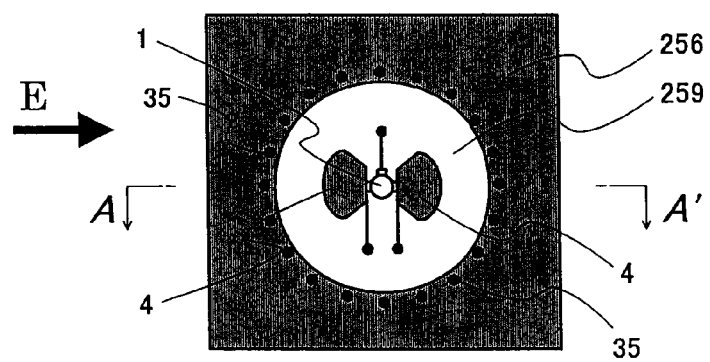
FIG. 12 is a set of schematic diagrams of a fifth configuration example of a resonant cavity applicable in the present invention.
Figure 12:
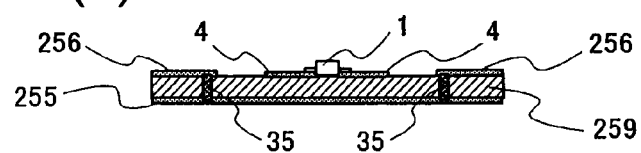

The fifth modification shown in FIG. 12 is an example in which a signal transmitted through the interior of the dielectric substrate 259 is prevented from leakage and loss from the edge of the substrate by surrounding approximately fan-shaped conductor patches 4, 4 with a GND conductor surface 256 and through-holes 35 connecting the GND conductor surface 256 and a GND conductor surface 255. Instead of transmitting the signal inside the dielectric substrate 259, it is possible by appropriately defining the dimensions and shape of the GND conductor surface 256 to use the lost signal energy for its original purpose as radiation energy.

Figure 13:
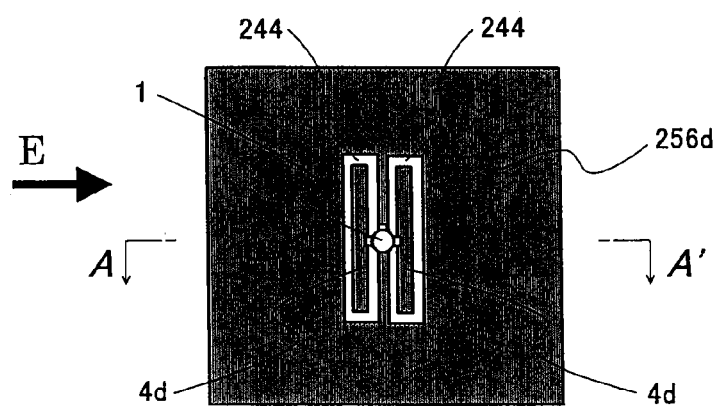
FIG. 13 is a set of schematic diagrams of a sixth configuration example of a resonant cavity applicable in the present invention.
Figure 13:
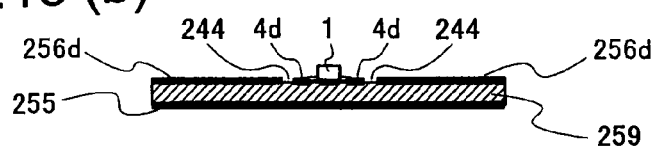

Shown in FIG. 13 is a sixth modification in which a resonant cavity for oscillation is configured by rectangular conductor patches 4d, 4d and a ground conductor surface 256d arranged to maintain appropriate gaps 244 with respect to the conductor patches 4d, 4d.

Figure 14:
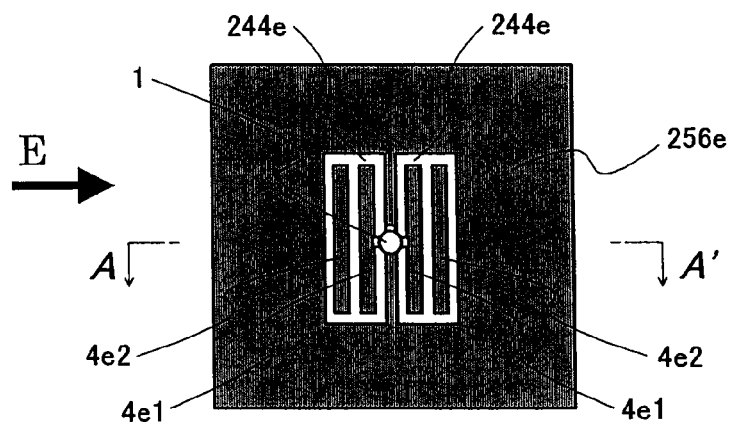
FIG. 14 is a set of schematic diagrams of a seventh configuration example of a resonant cavity applicable in the present invention.
Figure 14:
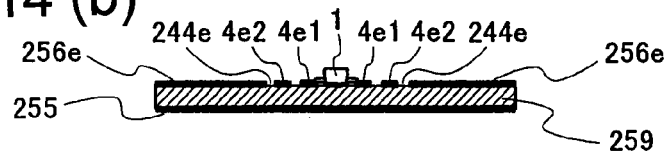

Shown in FIG. 14 is a seventh modification in which a resonant cavity for oscillation is configured by providing rectangular conductor patches 4e2, 4e2 not connected to a high-frequency transistor 1 near rectangular conductor patches 4e1, 4e1 connected to the high-frequency transistor 1 and spacing the conductor patches 4e1 from the conductor patches 4e2 and from a ground conductor surface 256e by gaps 244e.

Figure 15:
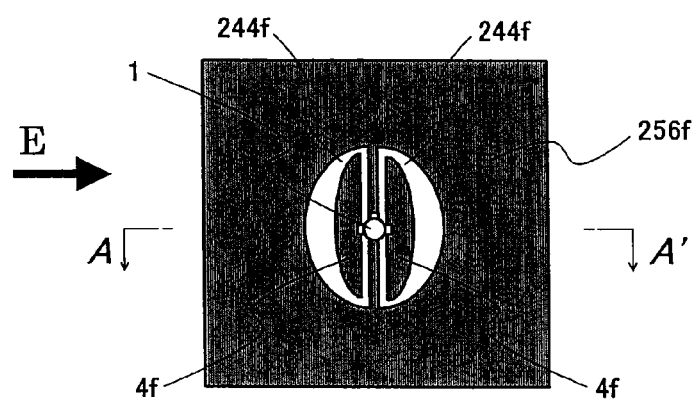
FIG. 15 is a set of schematic diagrams of an eighth configuration example of a resonant cavity applicable in the present invention.
Figure 15:
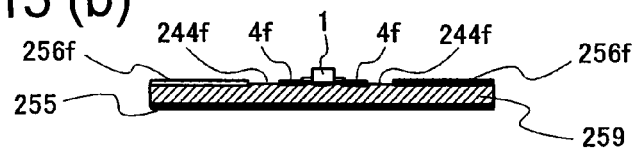

Shown in FIG. 15 is an eighth modification in which a resonant cavity for oscillation is configured by semi-elliptical conductor patches 4f, 4f and a ground conductor surface 256f arranged to maintain appropriate gaps 244f with respect to these conductor patches 4f, 4f. The width of the gaps 244f is varied with location to satisfy the oscillation condition.

The shapes of the conductor patches and gaps is not limited to the configuration examples shown in the aforesaid FIGS. 12~15 and any configuration can be applied in the present invention insofar as it satisfies the oscillation condition. Moreover, although the conductor patches, gaps, GND conductor surfaces and dielectric substrate constitute part of the feedback circuit for oscillating operation, provision of the dielectric substrate 259 and GND conductor surface 255 is not absolutely necessary insofar as the feedback can be suitably achieved. Note that the radiation when the GND conductor surface 255 is not present is in the direction of both surfaces of the conductor patches.

Figure 16:
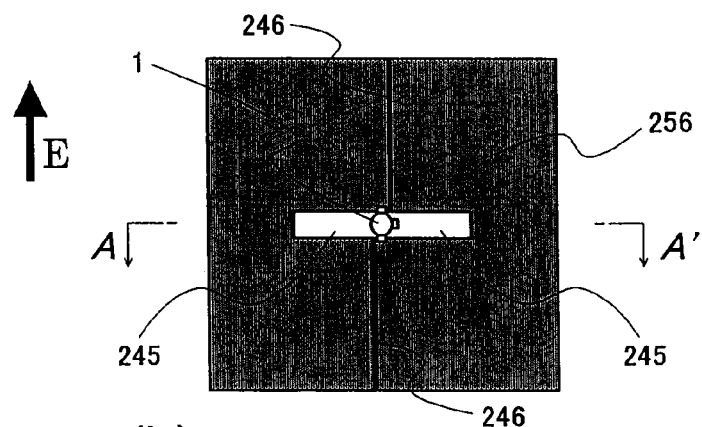
FIG. 16 is a set of schematic diagrams of a ninth configuration example of a resonant cavity applicable in the present invention.
Figure 16:
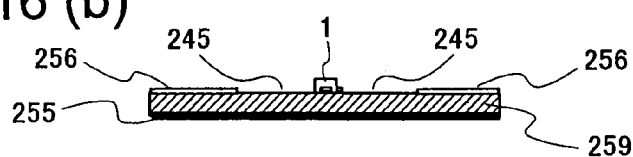

Shown in FIG. 16 is a ninth modification in which a resonant cavity for oscillation is configured by slots 245 and a ground conductor surface 256. The slots 245 are in a complementary relationship with the rectangular conductor patches 4*a* illustrated in FIG. 8 and satisfy the oscillation condition. The shape of the slots 245 is of course not particularly limited insofar as the oscillation condition is satisfied. In this configuration example, the gate and drain of the high-frequency transistor 1 are applied with different DC bias voltages, so that the gate and drain are separated direct-current-wise, and capacitive coupling sections 246 are provided for high-frequency conduction. The capacitive coupling sections 246 can be implemented using gap capacitance, MIM (Metal Insulator Metal) capacitance, capacitor parts or the like, and provision of the dielectric substrate 259 and GND conductor surface 255 is not absolutely necessary. Note that the radiation when the GND conductor surface 255 is not present is in the direction of both surfaces of the conductor patches.

Although the aforesaid modifications of the conductor patches are all examples in which a pair of conductor patches are provided symmetrically with respect to the high-frequency transistor 1, use of asymmetrically shaped conductor patches is also possible.

Figure 17:
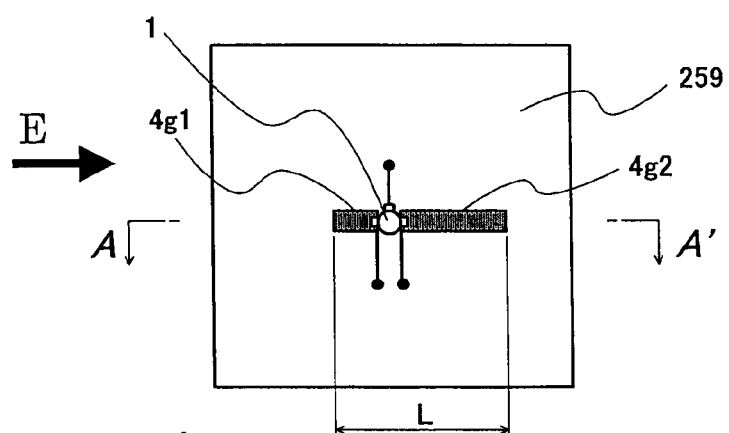
FIG. 17 is a set of schematic diagrams of a tenth configuration example of a resonant cavity applicable in the present invention.
Figure 17:
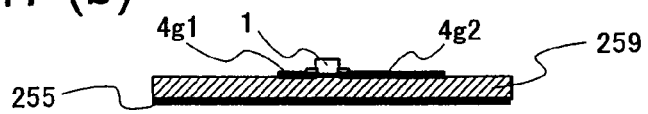

Shown in FIG. 17 is a tenth modification in which a rectangular first conductor patch 4*g*1 and a rectangular second conductor patch 4*g*2 are asymmetrically configured. Even if the first conductor patch 4*g*1 and second conductor patch 4*g*2 are made asymmetrical in this manner, operation as a radiation type oscillator of the type with the antenna and oscillating circuit forming a harmonious whole can be performed insofar as the oscillation condition is satisfied, because the resonant frequency is fundamentally determined by the size of the whole patch section (indicated as L in FIG. 17(*a*)).

Figure 18:
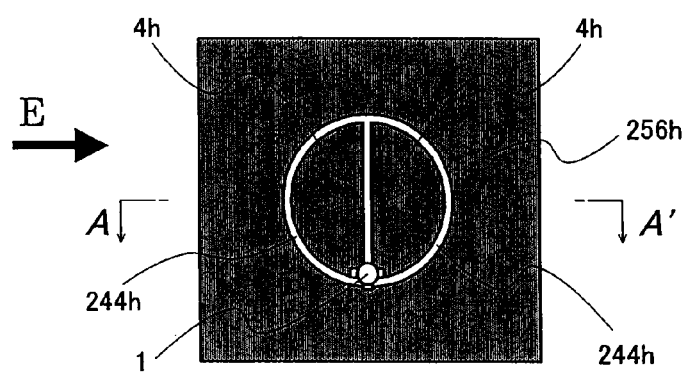
FIG. 18 is a set of schematic diagrams of an eleventh configuration example of a resonant cavity applicable in the present invention.
Figure 18:
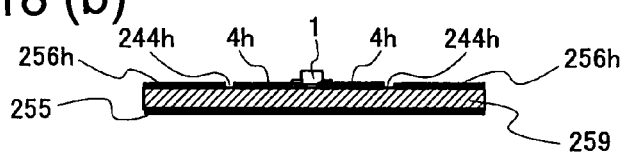

Shown in FIG. 18 is an eleventh modification in which a resonant cavity for oscillation is configured by using approximately semicircular conductor patches 4*h*, 4*h* and a ground conductor surface 256*h* arranged to maintain appropriate gaps 244*h* with respect to the conductor patches 4*h*, 4*h* to form a ring slot antenna on the radiation side.

Figure 19:
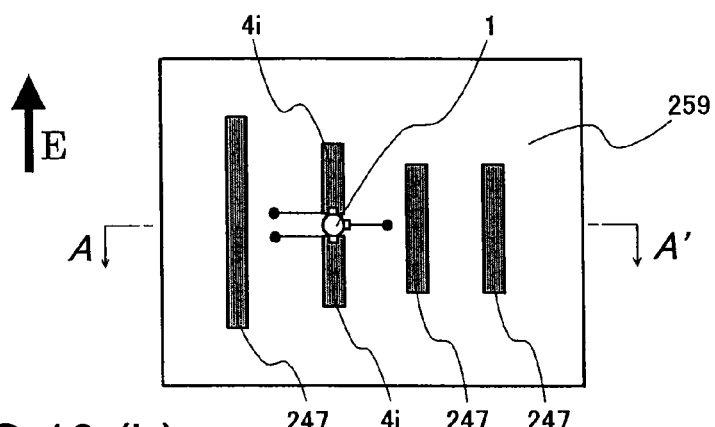
FIG. 19 is a set of schematic diagrams of a twelfth configuration example of a resonant cavity applicable in the present invention.
Figure 19:
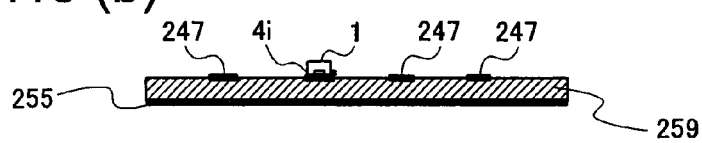

Shown in FIG. 19 is a twelfth modification that enables radiation directivity control by appropriately arranging conductor patches 247 not connected to the high-frequency transistor 1 around rectangular conductor patches 4*i*, 4*i*. Operation in the manner of, for example, a Yagi antenna can be achieved by appropriately defining the positional relationship and size relationship between the conductor patches 4*i*, 4*i* and conductor patches 247.

Figure 20:
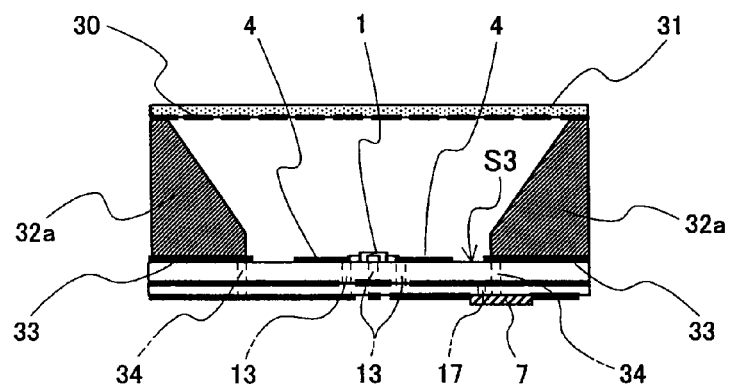
FIG. 20 is a schematic configuration diagram of a pulse wireless communication device according to a third embodiment of the present invention.

Next, the pulse wireless communication device according to a third embodiment will be explained based on FIG. 20. The pulse wireless communication device of the present embodiment is provided on a radiation oscillator substrate S3 (whose high-frequency pulse generating and radiating structure is the same as the radiation oscillator substrate S1, S1*a*, S1*b*, S1*c*, S2 or S2*a* set out in the foregoing and whose operation is also the same) with a Frequency Selective Surface (FSS) as a frequency selective filter means. Further, a grounding conductor structure is provided for preventing leakage of unnecessary signal components of a frequency lower than the frequency of the radiated high-frequency pulse signal (e.g., a base band signal component or monopulse signal component).

On the radiation direction side of the radiation oscillator substrate S3 is arranged an FSS substrate 31 patterned on the side of the inner surface (surface facing the radiation surface of the radiation oscillator substrate S3) with a low-pass filter pattern 30 and supported an appropriate distance apart from the radiation surface by a metal conductor structure 32*a* constituting a grounding conductor structure. The radiation oscillator substrate S3 is provided with a grounding conductor solid pattern 33 surrounding the periphery of the conductor patches 4 as in the fifth modification shown in FIG. 12 and this grounding conductor solid pattern 33 is connected to an inner layer GND via through-holes 34. Note that many through-holes 34 are arranged around the conductor patches at intervals adequately shorter than the wavelength.

The metal conductor structure 32*a* is in electrical contact with the inner layer GND through the grounding conductor solid pattern 33, and the metal conductor structure 32*a* functions as a frame ground of the present device (universal ground conductor of the whole device) with respect to direct current and relatively low frequencies. Moreover, the radiation directivity of the high-frequency pulse signal is sharpened by forming the metal conductor structure 32*a* with a horn-shaped radiation cavity whose diameter expands from the radiation surface side of the radiation oscillator substrate S3 toward the FSS substrate 31. In other words, the metal conductor structure 32*a* plays both the function of sharpening radiation directionality and the function of a frame ground.

Thus in the high-frequency pulse wireless communication device of the present embodiment equipped with the FSS substrate 31 and the metal conductor structure 32*a*, the unnecessary harmonic frequency components of the generated high-frequency pulse signal can be attenuated in the FSS substrate 31 formed in the low-pass filter pattern 30. In addition, the electromagnetic field of the base band signal and monopulse signal components (from direct current to relatively low frequency components) that tends to leak from the conductor patches 4 are trapped between the conductor patches 4 and the frame ground and do not come to be radiated. Note that when the base band signal and monopulse signal frequency components are adequately low relative to the high-frequency pulse signal frequency component, leakage prevention function is present even if the metal conductor structure 32*a* is removed and the frame ground is formed of only the grounding conductor solid pattern 33 and the inner layer GND.

Further, the high-frequency pulse wireless communication device of the present embodiment enables the RF circuit section to be isolated from the outside air because the high-frequency transistor 1 and conductor patch 4, 4 portion is in a state enclosed by the FSS substrate 31, the metal conductor structure 32*a* and the radiation oscillator substrate S3. Therefore, degradation of performance by the external environment can be prevented by the FSS substrate 31, the metal conductor structure 32*a* and the radiation oscillator substrate S3 serving as part of an air-tight housing of the present device.

Figure 21:
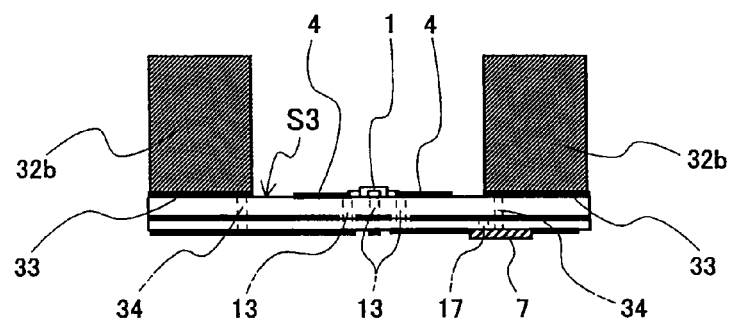
FIG. 21 is a schematic configuration diagram of a pulse wireless communication device according to a fourth embodiment of the present invention.
Figure 22:
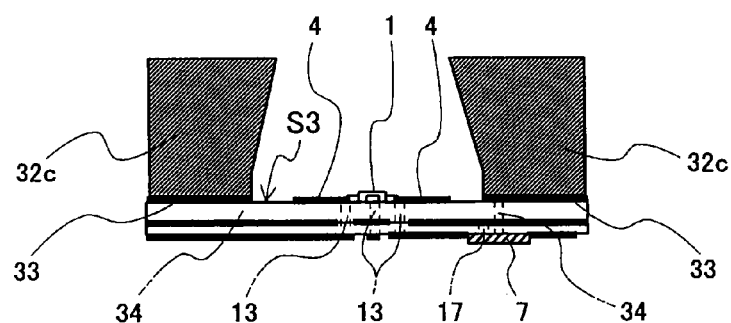
FIG. 22 is a schematic configuration diagram of a pulse wireless communication device according to a fifth embodiment of the present invention.

Further, unnecessary leakage of the base band signal and monopulse signal can be prevented by not adopting the horn configuration of expanding the diameter of the radiation cavity in the radiation direction as in the metal conductor structure 32*a* but, as seen in the metal conductor structure 32*b* shown in FIG. 21, giving it a straight tubular shape (fourth embodiment) or as seen in the metal conductor structure 32*c* shown in FIG. 22, giving it a shape that contracts in diameter in the radiation direction (fifth embodiment), and defining the size of its aperture so as to cut off the base band signal and monopulse signal frequency components. Defining the size of the aperture to achieve cutoff is to make it less than what is called the cutoff frequency in a waveguide (lower cutoff frequency), and the cutoff frequency is the borderline frequency where the electromagnetic wave can no longer advance in the axial direction of the guide. Such a low-cut filter is simple in structure, while also providing the function of a band-pass filter means and an unnecessary signal leakage prevention means utilizing a grounding conductor structure.

Further, it is also possible to selectively pass and radiate a desired harmonic frequency component by appropriately defining the circuit pattern provided in the FSS substrate 31 and attenuating the fundamental wave frequency of the generated high-frequency pulse signal. By positively utilizing the harmonic frequency component in this manner, without allowing it to become an unnecessary signal, a device capable of relatively high frequency pulse signal radiation can be realized even by using a low-cost, low-performance transistor of small fmax (maximum oscillation frequency). Note that in a harmonic pulse wireless communication device using a harmonic frequency component, the radiated power becomes weak compared with the case of using the fundamental wave frequency component but use as a signal source for close-range communication or a close-range sensor is possible.

Note that while the FSS used as a band-pass filter means in the present embodiment is realized by patterning the FSS substrate 31 with an FSS pattern surface, the substrate is not particularly necessary insofar as the FSS pattern surface can be retained.

Figure 23:
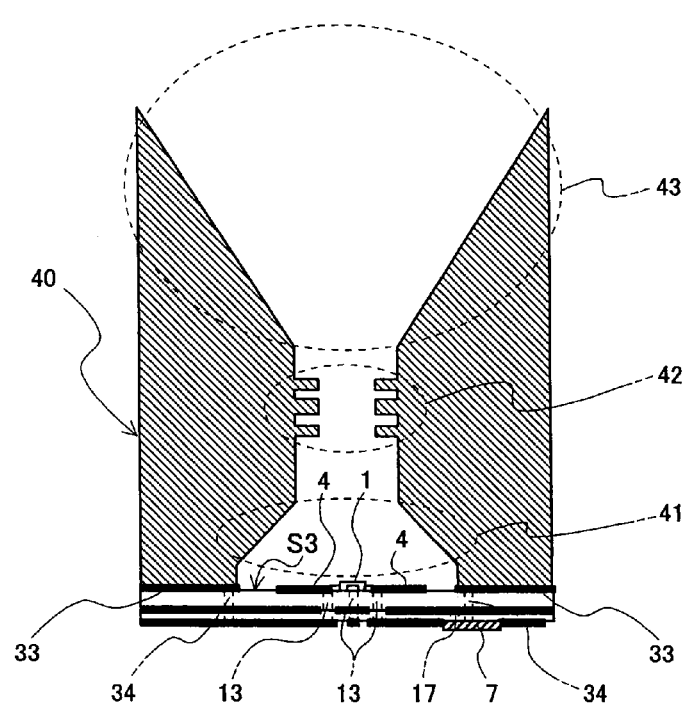
FIG. 23 is a schematic configuration diagram of a pulse wireless communication device according to a sixth embodiment of the present invention.

Further, the pulse wireless communication device of a sixth embodiment adopting a band-pass filter means other than an FSS is provided with a waveguide filter 40 as in FIG. 23.

The waveguide filter 40 is provided with a converter 41 for converting the radiation wave of the radiation type oscillator to a waveguide transmission wave, a filter 42 comprising an iris substrate and other waveguide circuitry, and a horn antenna 43 for radiating a passed signal of a desired RF band selected and passed or attenuated by the filter 42. Note that the converter 41 is one established, for example, by a tapered structure that progressively varies the guide thickness to the desired size of the waveguide aperture, and if the conductor patches 4 of the radiation oscillator substrate S3 should be of smaller size than the desired size of the waveguide aperture, the tapered structure is unnecessary and the structure suffices insofar as the radiation wave from the radiation oscillator substrate S3 can be efficiently converted to the transmission wave of the waveguide.

Although explanation was made based on a number of embodiments of the pulse wireless communication device according to the present invention, the present invention is not limited to these embodiments and all pulse wireless communication devices realizable without modifying the configurations set out in the claims for patent are subsumed within the scope of the right The aforesaid advantages of the wireless communication device of the present invention exhibiting the characteristic effects set out in the foregoing can be exploited by use in a UWB wireless system. It can be expected to offer especially great advantages in milliwave band systems that are high in part cost, and low in power efficiency owing to increased transmission loss or device performance.

As an example of the aforesaid UWB wireless system there is conceivable a system which conducts data communication among different equipment including, for example, a PC, peripheral device, AV equipment, mobile terminal or the like in a home or office environment. Also conceivable is a system which conducts inter-board data communication among multiple electronic circuit boards and the like inside the case of a computer or other equipment. Incorporating the wireless communication device according to the present invention in such systems makes it possible to achieve cableless interconnection at lower cost than in a system equipped with a conventional UWB wireless communication device. As a simple configuration of these systems, there is conceivable a configuration in which two pulse wireless communication devices according to the present invention are fabricated and arranged in opposition to have each of the pulse wireless communication devices perform transmit and receive operation, but the configuration and number of the opposite-party wireless communication devices with which the pulse wireless communication device according to the present invention communicates are not particularly limited, so that it is also possible to operate the pulse wireless communication device according to the present invention to perform only transmit operation or only receive operation.

Further, as examples of the aforesaid UWB wireless system, there are conceivable systems such as wireless sensor networks that combine wireless data communication and wireless sensors. When the pulse wireless communication device according to the present invention is applied to the sensor terminal devices of such a system, it is possible by making the pulse wireless communication device itself function also as a sensor to wirelessly transmit sensing result data to other equipment and to realize inter-sensor data communication in the same pulse wireless communication device. Although the wireless data transmit-receive unit and the sensor unit are generally separately configured, application of the pulse wireless communication device according to the present invention results in a structurally simple, low-cost system. Of particular note is that the advantages of simple structure and low cost can be exploited in a system utilizing many sensor terminal devices.

Note that in order to make the pulse wireless communication device of the present invention function as a sensor, it suffices to treat the high-frequency pulse signal radiated into space as a transmitted RF signal, treat a reflected wave of the transmitted RF signal from an object of detection as a received RF signal, cause the radiation type oscillator to perform oscillating operation when the received RF signal enters the radiation type oscillator, acquire an IF signal by homodyne mixing by the radiation type oscillator itself, and perform detection of the object of detection based on analysis and processing thereof.

The invention claimed is:

1. A pulse wireless communication device comprising:
a radiation type oscillator including a three-electrode high-frequency amplifying device being integrated with a resonator to generate negative resistance, perform an oscillating operation and simultaneously function as a transmitting and receiving antenna of the pulse wireless communication device;
wherein the three-electrode high-frequency amplifying device is operated based on a transmit data signal to establish a short-duration negative resistance, and a high-frequency pulse signal of an oscillating frequency/frequency band width, determined based on the negative resistance and a structure of a resonant cavity, is generated and simultaneously radiated into space;
the high-frequency pulse signal radiated into space constitutes a transmitted RF signal; and
the radiation type oscillator is caused to perform the oscillating operation when a received RF signal from an external wireless communication device enters the radiation type oscillator, whereby a received data signal is established based on acquisition of an IF signal owing to a mixing operation by the radiation type oscillator.

2. A pulse wireless communication device according to claim 1, wherein:
the three electrodes of the three-electrode high-frequency amplifying device of the radiation type oscillator are a controlled current inflow electrode, a controlled current outflow electrode and a control electrode, respectively;

a monopulse signal is supplied to the controlled current inflow electrode or the controlled current outflow electrode, and power of the monopulse signal is used as source power to establish the short-duration negative resistance; and an IF band load is interposed between the controlled current inflow electrode and a monopulse signal feed line and either the IF signal is extracted from between the IF band load and the controlled current inflow electrode or the IF band load is interposed between the controlled current outflow electrode and the monopulse signal feed line and the IF signal is extracted from between the IF band load and the controlled current outflow electrode.

3. A pulse wireless communication device according to claim 1, wherein:

the three electrodes of the three-electrode high-frequency amplifying device of the radiation type oscillator are a controlled current inflow electrode, a controlled current outflow electrode and a control electrode, respectively;

a monopulse signal is supplied to the control electrode to cause short-duration controlled current to flow and establish the short-duration negative resistance; and an IF band load is interposed between the controlled current inflow electrode and a direct current source feed line and either the IF signal is extracted from between the IF band load and the controlled current inflow electrode or the IF band load is interposed between the controlled current outflow electrode and the direct current source feed line, thereby extracting the IF signal from between the IF band load and the controlled current outflow electrode.

4. A pulse wireless communication device according to claim 2, wherein a monopulse signal generation circuit is integrated into the radiation type oscillator.

5. A pulse wireless communication device according to claim 1, wherein amplification gain in an IF band is used to amplify the IF signal from direct current associated with the three-electrode high-frequency amplifying device of the radiation type oscillator during the oscillating operation and during the mixing operation.

6. A pulse wireless communication device according to claim 1, wherein a pulse train pattern is defined in the high-frequency pulse signal of the transmitted RF signal, and the radiation type oscillator is used as a correlator.

7. A pulse wireless communication device according to claim 1, wherein, when the received RF signal enters the radiation type oscillator, the radiation type oscillator is caused to perform the oscillating operation at an arbitrary frequency different from the frequency of the high-frequency pulse signal of the received RF signal.

8. A pulse wireless communication device according to claim 1, wherein a band-pass filter that selectively filters waves of a required frequency is disposed a distance from a radiation surface of the radiation type oscillator.

9. A pulse wireless communication device according to claim 1, wherein a grounding conductor structure is provided on a radiation direction side of the radiation type oscillator to prevent leakage of unnecessary signal components of a frequency lower than a frequency of the radiated high-frequency pulse signal.

* * * * *